(12) United States Patent
Saitoh

(10) Patent No.: US 6,544,721 B1
(45) Date of Patent: *Apr. 8, 2003

(54) MULTIPLE EXPOSURE METHOD

(75) Inventor: Kenji Saitoh, Utsunomiya (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/332,108

(22) Filed: Jun. 14, 1999

(30) Foreign Application Priority Data

Jun. 16, 1998 (JP) .......................................... 10-185681

(51) Int. Cl.⁷ .............................. G03C 5/00; G03F 9/00
(52) U.S. Cl. ............................ 430/312; 430/5; 430/22; 430/394; 430/396
(58) Field of Search ................. 430/5, 22, 30, 430/311, 312, 394, 396, 397, 313, 328

(56) References Cited

U.S. PATENT DOCUMENTS 5,952,160 A * 9/1999 Bakeman, Jr. et al. ...... 430/394
5,958,656 A * 9/1999 Nakao ........................ 430/394

FOREIGN PATENT DOCUMENTS

| JP | 58-173744 | 10/1983 |
| JP | 62-50811 | 10/1987 |
| JP | 6-83032 | 3/1994 |
| JP | 7-50243 | 2/1995 |
| JP | 07-226362 | 8/1995 |
| JP | 08-320572 | 12/1996 |

OTHER PUBLICATIONS

Levenson, et al., "Improving Resolution in Photolithography With a Phase–Shifting Mask", IEEE Transactions on Electron Devices, vol. ED–29, No. 12, Dec. 1982, pp. 1828–1836.

Levenson, et al., "The Phase–Shifting Mask II: Imaging Simulations and Submicrometer Resist Exposures", IEEE Transactions on Electron Devices, vol. ED–31, No. 6, Jun. 1984, pp. 753–763.

Hasegawa, et al., "Practical Applications of IDEAL Exposure Method", SPIE vol. 3873, pp 65–77 (Sep. 1999).

Hasegawa, et al., "New Approach for Realizing K1=0.3 Optical Lithography", SPIE vol. 3748, pp 278–279 (Sep. 1999).

Saitoh, et al., "Practical Use of IDEAL Exposure Method", Silicon Technology, vol. No. 11, pp. 6–11.

* cited by examiner

Primary Examiner—Mark F. Huff
Assistant Examiner—Saleha R. Mohamedulla
(74) Attorney, Agent, or Firm—Fitzpatrick, Cella, Harper & Scinto

(57) ABSTRACT

A method or an apparatus for exposing a resist or a substrate in manufacturing a semiconductor device or the like by using phase shifting masks is arranged to make a multiple exposure to obtain a desired circuit pattern on the substrate. For this purpose, first and second masks are arranged to have phase shift areas formed in the desired pattern in such a way as to give respective different phase shifting effects.

21 Claims, 27 Drawing Sheets

31  32 33           31

PHASE OF LIGHT JUST BELOW MASK

PHASE OF LIGHT ON MATERIAL TO BE EXPOSED

INTENSITY OF LIGHT ON MATERIAL TO BE EXPOSED

MULTIPLE EXPOSURE METHOD

BACKGROUND OF THE INVENTION

1. Field of the Invention

The present invention relates to an exposure method and an exposure apparatus, and more particularly to a method and an apparatus adapted for exposing a photosensitive substrate to light with a minute circuit pattern so as to manufacture devices of varied kinds, including semiconductor chips such as an IC and an LSI, display elements such as a liquid crystal panel, detection elements such as a magnetic head, and image pickup elements such as a CCD.

2. Description of Related Art

In manufacturing devices such as an IC, an LSI, a liquid crystal panel, etc., by using photolithography techniques, a projection exposure method or a projection exposure apparatus is used to project, through a projection optical system, a circuit pattern formed on a photomask, a reticle or the like (hereinafter referred to as a mask) onto a photosensitive substrate, such as a silicon wafer or a glass plate, coated with a photoresist (hereinafter referred to as a wafer) and to transfer the circuit pattern to the wafer (i.e., expose the wafer to light with the circuit pattern).

To meet a recent trend of increasing the degree of integration of the above-stated devices, a circuit pattern to be transferred to the wafer is required to be more finely and minutely prepared. In other words, it is desired to have a higher resolution and to permit an increase of the area of one chip on the wafer. Hence, the projection exposure method or the projection exposure apparatus which plays a main role in the art of accomplishing minute work on the wafer is being developed these days to increase the resolution and the exposure area in such a way as to form the image of the circuit pattern at a line width not greater than 0.5 $\mu$m over a larger range.

FIG. 39 schematically illustrates the arrangement of a projection exposure apparatus conventionally employed. The illustration of FIG. 39 includes an excimer laser 191 which is a light source used for a far ultraviolet ray exposure, an illumination optical system 192, illumination light 193 radiated from the illumination optical system 192, a mask 194, object-side exposure light coming through the mask 194 to be incident on a projection optical system 196, the projection optical system 196 which is a demagnification exposure type optical system, image-side exposure light 197 coming from the projection optical system 196 to be incident on a substrate 198, the substrate 198 which is a wafer as a photosensitive substrate, and a substrate stage 199 arranged to hold the wafer (substrate) 198.

A laser beam emitted from the excimer laser 191 is led to the illumination optical system 192 through delivery optics (190a and 190b). The laser beam is adjusted by the illumination optical system 192 to be converted into the illumination light 193 which has a light intensity distribution, a luminance distribution, an aperture angle (numerical aperture NA), etc., which are predetermined. Then, the mask 194 is illuminated with the illumination light 193. On a quartz substrate of the mask 194, there is formed, with chromium or the like, a pattern which corresponds to a minute pattern to be formed on the wafer 198. The pattern on the mask 194 is in such a size that is obtained by multiplying the size of the minute pattern on the wafer 198 by a reciprocal number of the projection magnification of the projection optical system 196 (for example, two, four or five times). The illumination light 193 is diffracted through the minute pattern of the mask 194 to become the object-side exposure light 195. The projection optical system 196 converts the object-side exposure light 195 into the image-side exposure light 197, which forms an image of the minute pattern of the mask 194 on the surface of the wafer 198 at the above-stated projection magnification and with sufficiently small aberration. As shown in an enlarged view at the lower left part of FIG. 39, the image-side exposure light 197 converges on the wafer 198 at a predetermined numerical aperture NA (=sin θ) to form the image of the minute pattern on the wafer 198. When the minute pattern is to be formed on a plurality of different areas (shot areas which become one or a plurality of chips) of the wafer 198 one after another, the substrate stage 199 is moved stepwise along the image plane of the projection optical system 196 in such a way as to vary the position of the wafer 198 relative to the projection optical system 196.

The projection exposure apparatus which uses the excimer later as a light source and is most popularly in use these days has a high projection resolving power. However, it is technically difficult to form a pattern image of a line width not greater than, say, 0.15 um with the projection exposure apparatus.

The resolution of the projection optical system 196 is limited by a trade-off between the optical resolution and the depth of focus which depend on the exposure wavelength (wavelength of light used for exposure). The resolution R and the depth of focus DOF of the projection exposure apparatus are expressed by the following Rayleigh's formulas (1) and (2):

$$R = k_1 \cdot (\lambda/NA) \tag{1}$$

$$DOF = k_2 \cdot (\lambda/NA^2) \tag{2}$$

In these formulas, "$\lambda$" represents the exposure wavelength, "NA" represents a numerical aperture on the image side indicating the brightness of the projection optical system 196, and $k_1$ and $k_2$ represent constants which are normally between 0.5 and 0.7 and are determined by the characteristic of a developing process on the wafer 198, etc. According to the formulas (1) and (2), in order to make the value of the resolution R smaller for a higher resolution, it is conceivable to increase the numerical aperture NA. However, in actually making an exposure, it is difficult to increase the numerical aperture NA more than a certain extent, because the depth of focus DOF of the projection optical system 196 must be kept above a certain value. In order to increase the resolution, therefore, it is necessary to make the exposure wavelength $\lambda$ smaller for shorter wavelength after all.

The attempt to shorten the exposure wavelength, however, encounters a serious problem. The problem lies in that it becomes hardly possible to find any optical material for lenses which form the projection optical system 196. Almost all optical materials have their transmission factors near to "0" in the far ultraviolet region. Although there is a fused quartz material which is manufactured by a special method for an exposure apparatus to have an exposure wavelength of about 248 nm, the transmission factor of the fused quartz also abruptly drops for the exposure wavelength not greater than 193 nm. It is thus extremely difficult to develop any optical material practically usable for an exposure wavelength not greater than 150 nm required for a minute pattern of line width not greater than 0.15 $\mu$m. Besides, any optical material to be used within the far ultraviolet region is required to satisfy a plurality of conditions relative to durability, uniform refractive index, optical strain, workability, etc., in addition to the transmission factor. Accordingly, it is doubted whether there exits any practically-usable optical material.

Use of some of optical materials, such as $CaF_2$, $MgF_2$, etc., that have a fairly good transmission factor even for the wavelength of 150 nm or thereabout has recently come to be considered. However, the exposure wavelength is of course preferred to be longer.

As described above, in order to form on the wafer a pattern of a line width not greater than 0.15 μm, the conventional projection exposure method and apparatus necessitate the exposure wavelength to be shortened down to a wavelength not greater than 150 nm. For this wavelength region, however, no practically-usable optical material is obtainable at present. Therefore, it has been hardly possible to form on the wafer any pattern of a line width not greater than 0.15 μm.

With the above background taken into consideration, in the art of obtaining a minutely designed semiconductor device by photolithography, a phase shifting art for attaining a further improved resolution is attracting attention. The phase shifting art is developed to improve the light intensity profile by giving a phase shift to light passing through a mask.

The prior art for phase shifting is disclosed in Japanese Laid-Open Patent Application No. SHO 58-173744, an article entitled "Improving Resolution in Photolithography with a Phase-Shifting Mask" by Marc D. Levenson, et al., IEEE Transactions on Electron Devices, Vol. ED-29, No. 12, December 1982, PP. 1828–1836, and another article entitled "The Phase-shifting Mask II: Imaging Simulations and Submicrometer Resist Exposures" by Marc D. Levenson, et al., IEEE Transactions on Electron Devices, Vol. ED-31, No. 6, June 1984, PP. 753–763.

Further, in Japanese Patent Publication No. SHO 62-50811, there is disclosed a phase shifting mask arranged to have a predetermined pattern composed of transparent parts and opaque parts. In the phase shifting mask, a phase member is provided on at least one of two transparent parts sandwiching the opaque part on its two sides, thereby bringing about a phase shift at the transparent parts on the two sides of the opaque part.

A phase shifting art called the Levenson type among known phase shifting arts is described below with reference to FIGS. 40(a) and 40(b).

In forming a line-and-space pattern on a wafer, an ordinary conventional mask is arranged as shown in FIG. 40(a). Referring to FIG. 40(a), light blocking parts 10 are formed with a light blocking material, such as Cr (chromium), some other metal or some metal oxide, on a transparent substrate 1 such as a quartz substrate. A line-and-space repeating pattern is formed by the light blocking parts 10, so that a mask for exposure is made. An intensity distribution of light passing through the mask for exposure is set such that, as indicated by reference symbol Al in FIG. 40(a), in an ideal state, the light is zero at each of the light blocking parts 10 and passes at the other parts, i.e., at light-transmitting parts 12a and 12b.

Considering one light-transmitting part 12a, the transmitted light to be given to a material to be exposed is caused to have a light intensity distribution A2 by the diffraction of light, etc. As shown in 40(a), the light intensity distribution A2 has hill-like maximum parts on its two skirt sides. At the other light-transmitting part 12b, the transmitted light is caused to have a light intensity distribution A2' as indicated by a one-dot-chain line. When light fluxes passing through the two light-transmitting parts 12a and 12b join each other to have a light intensity distribution A3, their light intensity distributions lose sharpness as shown by the light intensity distribution A3. Then, the image of the pattern is caused to blur by the diffraction of light. As a result, it becomes impossible to make a sharp exposure. On the other hand, if a phase shift part 11a which is called a shifter and is made of $SiO_2$ or a resist is provided on every other light-transmitting parts 12a and 12b of the above-stated repeating pattern in a manner as shown in FIG. 40(b), the blur of image due to diffraction of light is cancelled by the inversion of phase, so that the image of the pattern can be sharply transferred, thereby improving the resolving power and the depth of focus.

More specifically, as shown in FIG. 40(b), when the phase shift part 11a is formed on one light-transmitting part 12a to give a phase shift of, for example, 180 degrees, a light portion passing through the phase shift part 11a is inverted as indicated by reference symbol B1. Meanwhile, another light portion passing through the adjoining light-transmitting part 12b is not inverted as there is no phase shift part. The phase-inverted light portion and the adjoining light portion to be given to the material to be exposed then act to offset each other at a skirt part of the light intensity distribution curve as indicated by reference symbol B2 in FIG. 40(b). As a result, the distribution of light applied to the material to be exposed takes an ideally sharp shape as indicated by reference symbol B3 in FIG. 40(b).

In the above-stated case, in order to ensure a maximum effect of the phase shifting arrangement, it is most advantageous to have the phases of the adjacent light portions inverted 180 degrees relative to each other. For this purpose, the phase shift part 11a is formed with a film of a thickness D, which can be expressed as follows:

$$D = \frac{\lambda}{2(n-1)}$$

where "n" represents the refractive index of a material with which the phase shift part is formed, and λ represents the exposure wavelength.

The phase shifting mask arranged as described above to shift the phases of light portions passing through the adjacent light-transmitting parts relative to each other (ideally, to invert 180 degrees ) is called a spatial frequency modulating type (or a Levenson type). Phase shifting masks of other types include, for example, an edge emphasizing type, a light-blocking-effect emphasizing type, etc. Although a type having no light-blocking parts (called a chromeless type or the like) is included in the above various types of phase shifting masks, in each of those types, a phase shift part is provided to shift the phase of light passing through one part of the mask relative to the phase of light passing through an adjacent part of the mask.

In Japanese Laid-Open Patent Application No. HEI 6-83032, there is disclosed a multiple exposure method using two phase shifting masks. According to this method, an exposure is made by using a first phase shifting mask in which light-transmitting parts and phase shift parts are alternately formed, and another exposure is made by using a second phase shifting mask in which light-transmitting parts and phase shift parts are formed in an arrangement inverse to the arrangement of the first phase shifting mask.

Further, in Japanese Laid-Open Patent Application No. HEI 7-50243, there is disclosed another exposure method. In that method, phase shifters are provided in predetermined positions of light-transmitting areas of a mask in which a plurality of patterns are formed at intervals which are about the same as or shorter than the exposure wavelength, so as to bring about a phase shift between one passing light portion and another when a sample is exposed with projected images of the plurality of patterns. In that instance, among patterns to be formed consecutively by exposures, at least one of the consecutive patterns is divided into a pattern portion for which the boundary of phase inversion occurs in the transmitted light passing through the corresponding light-transmitting area and the other pattern portion, and the divided pattern portions are respectively formed on different masks. Then, exposures are made while adjusting the relative positions of the two masks.

However, the circuit pattern of an integrated circuit to be actually transferred to a semiconductor wafer is designed in a complicated manner and is not simply composed of vertical and horizontal pattern lines. In cases where a plurality of patterns are included in a closed pattern as shown in FIG. 41 and where a pattern includes a U-shaped pattern as shown in FIG. 42, the conventional multiple exposure method using the phase shifting mask often fails to effectively carry out the exposure.

BRIEF SUMMARY OF THE INVENTION

It is an object of the invention to provide masks, an exposure method and an exposure apparatus by which an exposure can be effectively carried out by using phase shifting masks even for a complicated pattern.

To attain the above object, in accordance with an aspect of the invention, there are provided a pair of masks, i.e., a first mask and a second mask, used for a multiple exposure to expose a substrate with a desired pattern, wherein the first mask and the second mask have respective phase shift areas formed correspondingly with the desired pattern and having respective different phase shifting effects.

More specifically, the phase shift areas of the first and second masks are arranged to cause the phase of light passing there to be shifted 180 degrees from the phase of light passing light-transmitting parts of the first and second masks other than the phase shift areas.

The phase shift area of the first mask is set in such a way as to resolve minute lines in one direction, and the phase shift area of the second mask is set in such a way as to resolve minute lines in another direction perpendicular to the one direction.

The pattern on each mask is set to be used for an exposure with light of a wavelength not greater than 250 nm.

In accordance with another aspect of the invention, there is provided an exposure method for making a multiple exposure by using the first and second masks. The term "multiple exposure" as used herein means an exposure process to be performed a plurality of times without performing a developing action on a resist between one exposure and another exposure on one and the same area of the resist.

In accordance with a further aspect of the invention, there is provided an exposure method for exposing a resist in a certain pattern, comprising a first exposure step of exposing the resist through a first mask, and a second exposure step of exposing the resist through a second mask, wherein the first exposure step and the second exposure step are either serially executed in the mentioned order or in the reverse order or simultaneously executed, and, if the first exposure step and the second exposure step are serially executed, no developing process is performed on the resist between the first exposure step and the second exposure step, wherein each of the first mask and the second mask has a light-blocking part and a non-light-blocking part, and a shape of the non-light-blocking part of the first mask and a shape of the non-light-blocking part of the second mask are substantially the same as a shape of the pattern, wherein the first mask is arranged such that predetermined areas, within the non-light-blocking part thereof, which are adjacent to each other across the light-blocking part thereof at least in a first direction give a phase shift of substantially an odd-number of times as much as $\pi$ between light portions propagating through the respective predetermined areas, and wherein the second mask is arranged such that predetermined areas, within the non-light-blocking part thereof, which are adjacent to each other across the light-blocking part thereof at least in a second direction different from the first direction give a phase shift of substantially an odd-number of times as much as $\pi$ between light portions propagating through the respective predetermined areas.

In accordance with a further aspect of the invention, there is provided an exposure method for exposing a resist in a certain pattern, comprising a first exposure step of exposing the resist through a first mask, and a second exposure step of exposing the resist through a second mask, wherein the first exposure step and the second exposure step are either serially executed in the mentioned order or in the reverse order or simultaneously executed, and, if the first exposure step and the second exposure step are serially executed, no developing process is performed on the resist between the first exposure step and the second exposure step, wherein each of the first mask and the second mask has a light-blocking part and a non-light-blocking part, and a shape of the non-light-blocking part of the first mask and a shape of the non-light-blocking part of the second mask are substantially the same as a shape of the pattern, wherein the first mask is arranged such that, within the non-light-blocking part thereof, a boundary of phases is formed along a first direction and predetermined areas which are adjacent to each other across the boundary give a phase shift of substantially an odd-number of times as much as n between light portions propagating through the respective predetermined areas, and wherein the second mask is arranged such that, within the non-light-blocking part thereof, a boundary of phases is formed along a second direction different from the first direction and predetermined areas which are adjacent to each other across the boundary give a phase shift of substantially an odd-number of times as much as $\pi$ between light portions propagating through the respective predetermined areas.

In accordance with a further aspect of the invention, there is provided an exposure method for exposing a resist in a certain pattern, comprising a first exposure step of exposing the resist through a first mask, and a second exposure step of exposing the resist through a second mask, wherein the first exposure step and the second exposure step are either serially executed in the mentioned order or in the reverse order or simultaneously executed, and, if the first exposure step and the second exposure step are serially executed, no developing process is performed on the resist between the first exposure step and the second exposure step, wherein each of the first mask and the second mask has a light-blocking part and a non-light-blocking part, and a shape of the non-light-blocking part of the first mask and a shape of the non-light-blocking part of the second mask are substantially the same as a shape of the pattern, wherein the first mask is arranged such that predetermined areas, within the non-light-blocking part thereof, which are adjacent to each other across the light-blocking part thereof at least in a first direction give a phase shift of substantially an odd-number of times as much as π between light portions propagating through the respective predetermined areas, and such that, within the non-light-blocking part thereof, a boundary of phases is formed along a third direction and predetermined areas which are adjacent to each other across the boundary give a phase shift of substantially an odd-number of times as much as π between light portions propagating through the respective predetermined areas, and wherein the second mask is arranged such that predetermined areas, within the non-light-blocking part thereof, which are adjacent to each other across the light-blocking part thereof at least in a second direction different from the first direction give a phase shift of substantially an odd-number of times as much as π between light portions propagating through the respective predetermined areas, and such that, within the non-light-blocking part thereof, a boundary of phases is formed along a fourth direction different from the third direction and predetermined areas which are adjacent to each other across the boundary give a phase shift of substantially an odd-number of times as much as π between light portions propagating through the respective predetermined areas.

In accordance with a further aspect of the invention, there is provided an exposure method for exposing a resist in a certain pattern, comprising a first exposure step of exposing the resist through a first mask, and a second exposure step of exposing the resist through a second mask, wherein the first exposure step and the second exposure step are either serially executed in the mentioned order or in the reverse order or simultaneously executed, and, if the first exposure step and the second exposure step are serially executed, no developing process is performed on the resist between the first exposure step and the second exposure step, wherein each of the first mask and the second mask has a light-blocking part and a non-light-blocking part, and a shape of the non-light-blocking part of the first mask and a shape of the non-light-blocking part of the second mask are substantially the same as a shape of the pattern, wherein the first mask gives a phase shift of an odd-number of times as much as n between light portions propagating through different areas of the non-light-blocking part in such a way as to have the resist exposed with a part of the pattern, and wherein the second mask gives a phase shift of an odd-number of times as much as π between light portions propagating through different areas of the non-light-blocking part in such a way as to have the resist exposed with another part of the pattern.

In accordance with a further aspect of the invention, there is provided an exposure apparatus which has an exposure mode in which a multiple exposure is performed by using the first and second masks.

In accordance with a further aspect of the invention, there is provided a method for manufacturing a device, in which the device is manufactured by exposing a wafer with a pattern for the device according to the above exposure method and, after that, carrying out a developing process on the exposed wafer.

The above and other objects and features of the invention will become apparent from the following detailed description of preferred embodiments thereof taken in connection with the accompanying drawings.

DETAILED DESCRIPTION OF THE INVENTION

Figure 1:
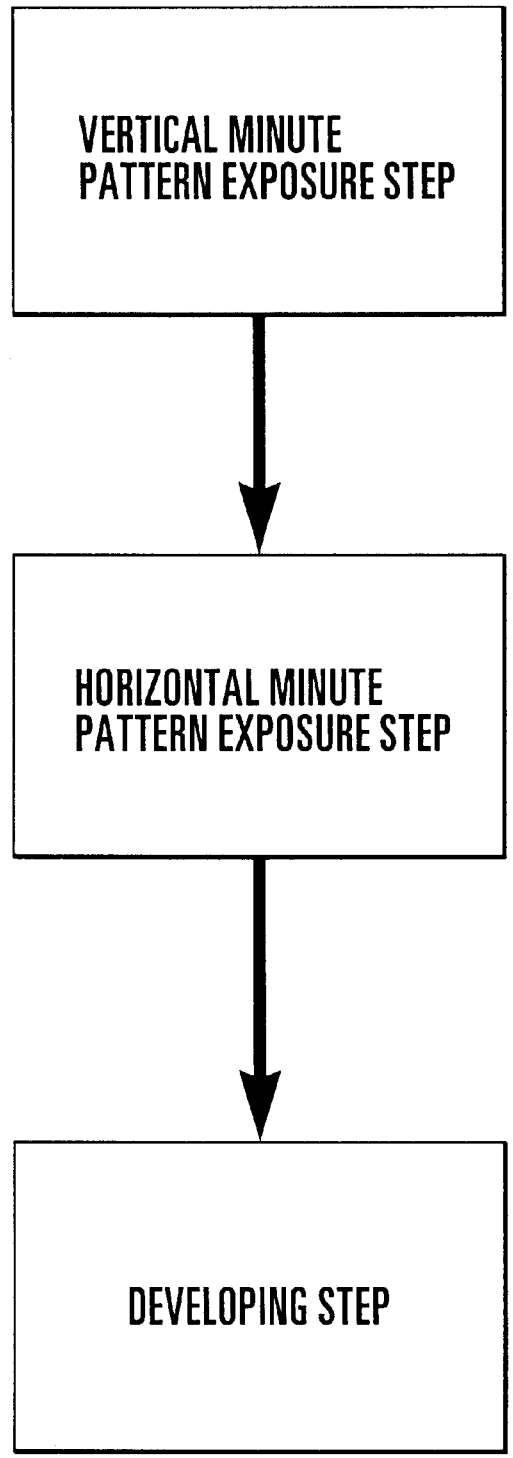
FIG. 1 is a flow chart showing an exposure method according to the invention.

Hereinafter, preferred embodiments of the invention will be described in detail with reference to the drawings.

Masks, exposure methods and exposure apparatuses according to the embodiments of the invention are characterized in that a multiple exposure is made by using a pair of masks which respectively have phase shift areas arranged to give respective different phase shifting effects in a desired pattern.

Such a pair of masks are edge-type phase shifting masks, and the phase shift between light portions passing through adjacent light-transmitting parts is set to 180 degrees. The phase shift areas arranged to give respective different phase shifting effects are set by arranging one of the pair of masks to have the phase shifting areas set in such a way as to resolve vertical minute lines in view of a vertical minute pattern and arranging the other mask to have the phase shifting areas set in such a way as to resolve horizontal minute lines in view of a horizontal minute pattern. The light of an excimer laser of a wavelength not greater than 250 nm is employed as exposure light.

In each of the embodiments of the invention, with respect to areas of a pattern corresponding to the smallest line width of an exposure pattern, phase shift areas are set for a vertical minute pattern. In this instance, a phase shifting mask is designed in such a way as to ensure reproduction of a vertical minute pattern, disregarding any dropout of boundary areas that may be caused to take place in the horizontal direction by the phase shift of 180 degrees.

Next, phase shift areas are set for a horizontal minute pattern in such a way as to ensure reproduction of the horizontal minute pattern, in the same manner as setting for the vertical direction. However, at this time, the phase shift areas are set by disregarding any dropout of boundary areas that may be caused to take place in the vertical direction by the phase shift of 180 degrees.

Thus, a pair of phase shifting masks having respective different phase shifting effects are made in the above-described manner. Then, one and the same wafer is double-exposed by supplying the pair of masks to a projection exposure apparatus one after another for first and second exposures. In the double exposure, first, an exposure amount distribution for the vertical minute pattern is formed by the first exposure on the surface to be exposed. Although, in the exposure amount distribution formed by the first exposure, a part of the pattern may be dropped out or blurred with respect to the horizontal direction, an exposure amount distribution for the horizontal minute pattern is superimposed by the second exposure on the exposure amount distribution formed by the first exposure.

In the exposure amount distribution formed by the second exposure, a part of the pattern may be dropped out or blurred with respect to the vertical direction. With the first and second exposures thus performed, the total exposure amount distribution gives a predetermined exposure amount or more to portions corresponding to the minute pattern structure. Therefore, a pattern having a minute complicated structure can be obtained by setting a threshold value of a resist to a value between the predetermined exposure amount and the exposure amount of unnecessary blurred areas.

Next, masks and an exposure method according to a first embodiment of the invention are described with reference to FIGS. 1 to 9. FIG. 1 is a flow chart showing the exposure method according to the invention. The flow of the exposure method shown in FIG. 1 includes a vertical minute pattern exposure step, a horizontal minute pattern exposure step, and a developing step. The sequence of the vertical minute pattern exposure step and the horizontal minute pattern exposure step may be reverse to that shown in FIG. 1. Further, if either one of the vertical minute pattern exposure step and the horizontal minute pattern exposure step includes a plurality of exposure steps, the vertical minute pattern exposure step and the horizontal minute pattern exposure step may be alternately executed.

Further, although there are provided some intermediate steps for precise position adjustment, etc., between the vertical minute pattern exposure step and the horizontal minute pattern exposure step, such intermediate steps are omitted from the flow chart of FIG. 1.

Figure 2:
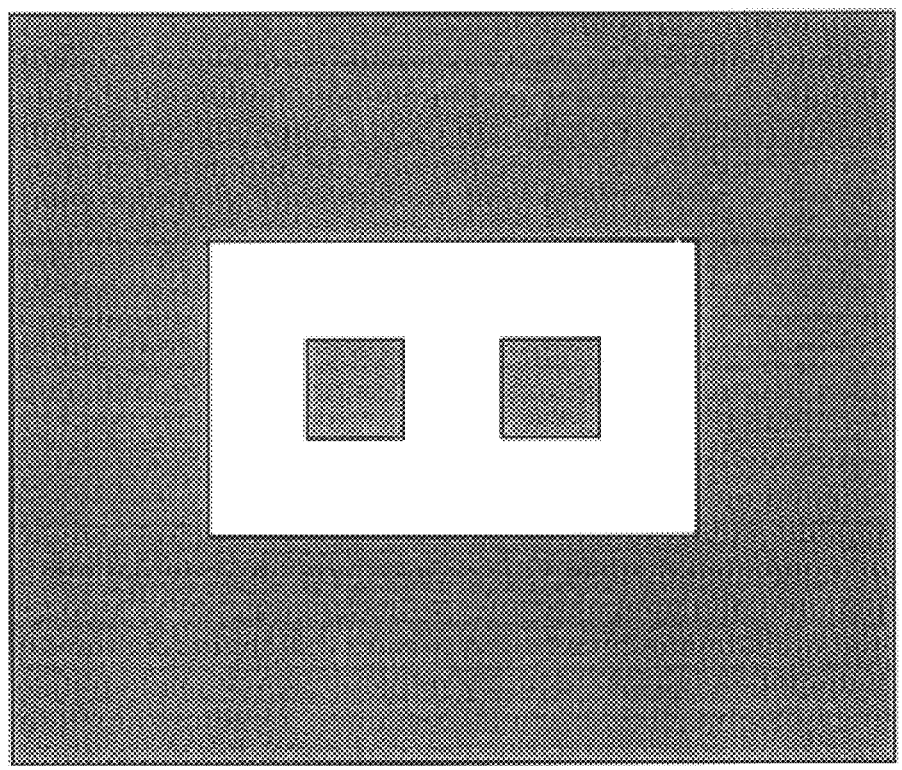
FIG. 2 is a diagram for explaining an exposure pattern in a first embodiment of the invention.

In the case of the first embodiment, an example is taken in which a multiple exposure is made with a desired, closed minute pattern as shown in FIG. 2. In a case where the multiple exposure is to be made according to the flow of operation shown in FIG. 1, a wafer, which is a photosensitive substrate, is first subjected to a first pattern exposure process using a first mask in which phase shift areas 31 as shown in FIG. 3 are set to resolve vertical minute lines in view of a vertical minute pattern.

Figure 3:
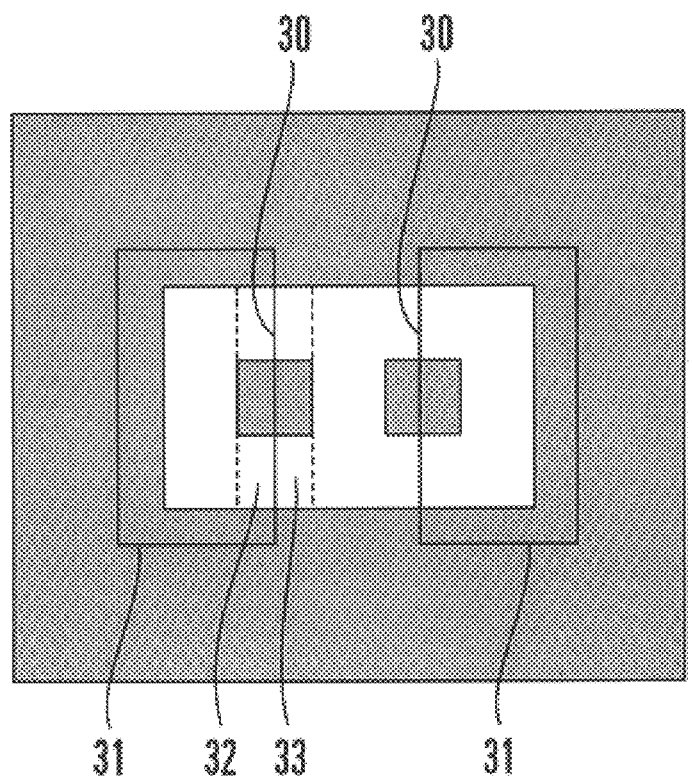
FIG. 3 is a diagram for explaining the pattern arrangement of a first mask in the first embodiment of the invention.
Figure 4:
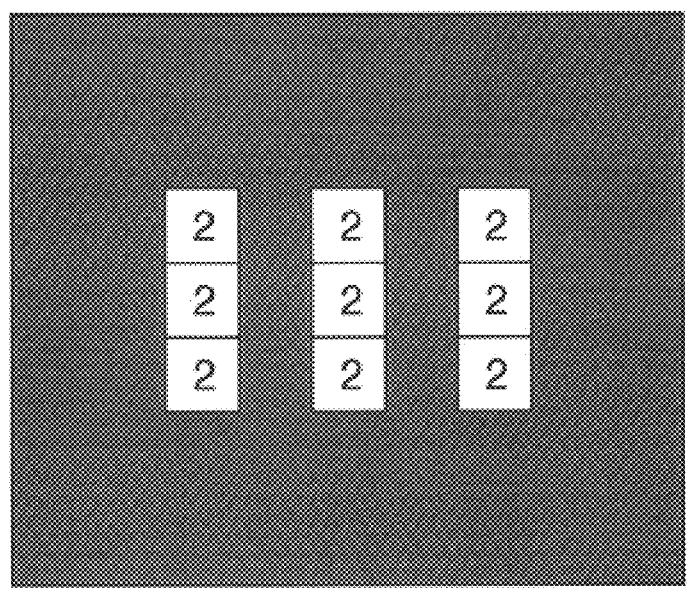
FIG. 4 is a diagram for explaining the distribution of exposure amounts obtained on the surface of a wafer with a first exposure in the first embodiment of the invention.

At this time, a light portion which passes through a phase shift area 32 located close to a boundary 30 and another light portion which passes through a non-phase-shift area 33 located close to the boundary 30, as shown in FIG. 3, differ in phase 180 degrees from each other. Therefore, the intensity of these light portions offset each other to make light intensity zero (0) there. As a result, an exposure amount distribution pattern as shown in FIG. 4 is obtained on the wafer by the first pattern exposure process. Incidentally, the similar description is also applied to other embodiments of the invention which will be described later.

In FIG. 4, reference numerals denote exposure amounts, while black parts indicate that the exposure amount is zero.

Figure 5:
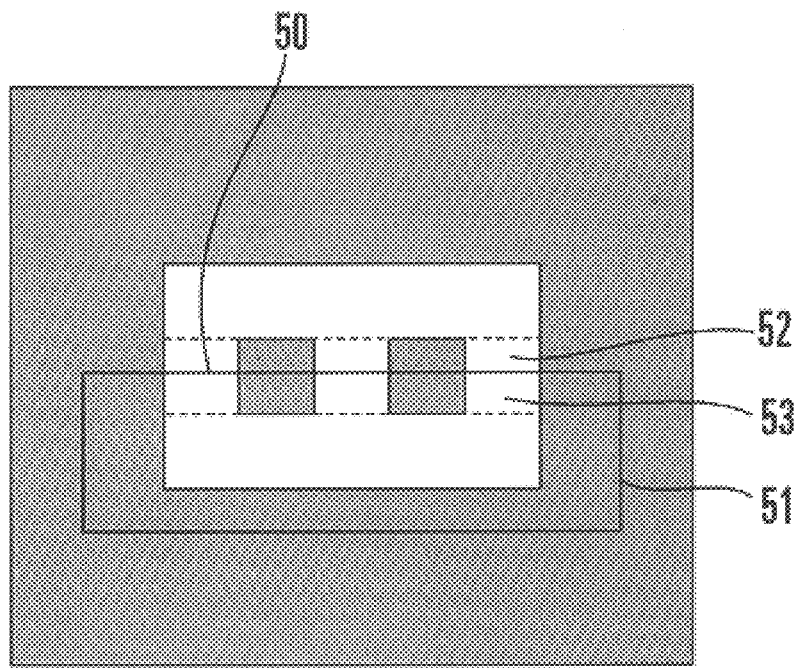
FIG. 5 is a diagram for explaining the pattern arrangement of a second mask in the first embodiment of the invention.

Next, the wafer is subjected to a second pattern exposure process using a second mask in which a phase shift area 51 as shown in FIG. 5 is set to resolve horizontal minute lines in view of a horizontal minute pattern.

Figure 6:
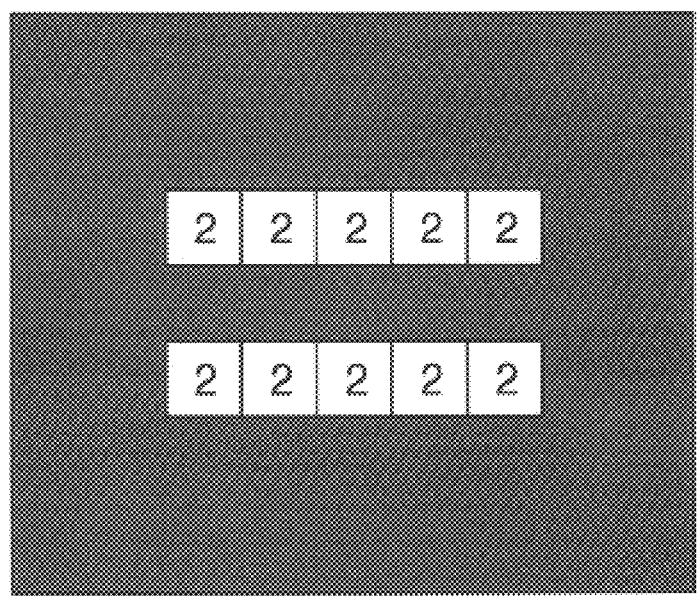
FIG. 6 is a diagram for explaining the distribution of exposure amounts obtained on the surface of the wafer with a second exposure in the first embodiment.

At this time, a light portion which passes through a phase shift area 53 located close to a boundary 50 and another light portion which passes through a nonphase-shift area 52 located close to the boundary 50, as shown in FIG. 5, differ in phase 180 degrees from each other. Therefore, the intensities of these light portions offset each other to make the light intensity zero (0) there, as in the case of the first pattern exposure process. As a result, an exposure amount distribution pattern as shown in FIG. 6 is obtained on the wafer by the second pattern exposure process.

Figure 7A:
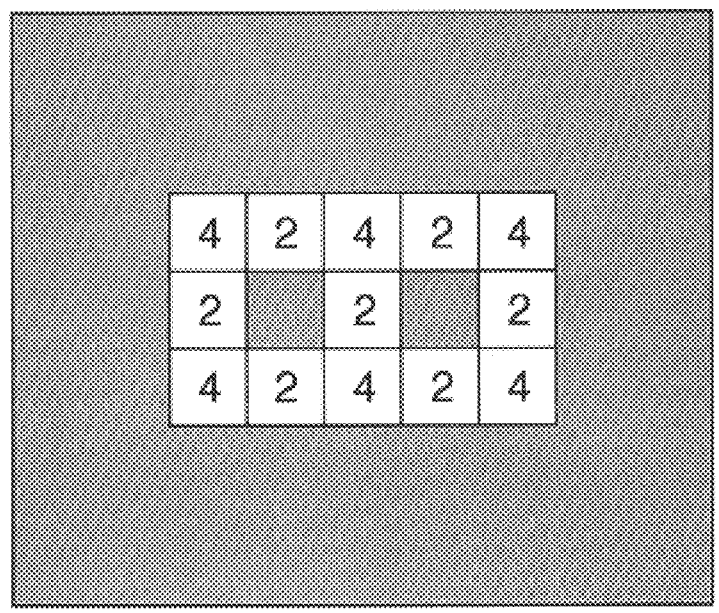
FIGS. 7(*a*) and 7(*b*) are diagrams for explaining respectively the distribution of exposure amounts and a resist image obtained by a double exposure in the first embodiment.

With the wafer double-exposed in the above-described manner, a total exposure amount distribution as shown in FIG. 7(a) is obtained on the wafer. When such an exposure pattern on the wafer is to be developed, an exposure threshold value Eth of a resist of the wafer as a photosensitive substrate is normally set to a value between exposure amount values "0" and "2".

Figure 8A:
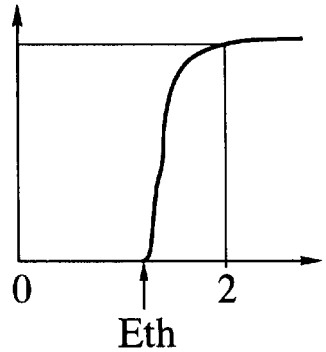
FIGS. 8(*a*) and 8(*b*) are diagrams for explaining exposure sensitivity characteristics of resists.
Figure 8B:
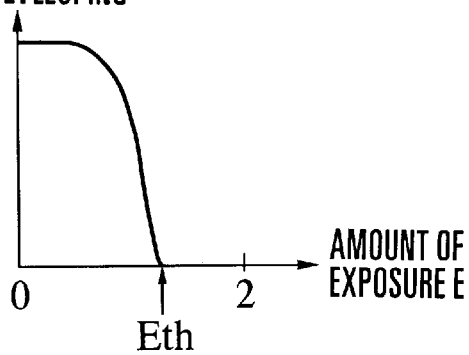

FIGS. 8(a) and 8(b) show, in respect of the resist of the wafer as a photosensitive substrate to be used in the above case, the exposure-amount dependency of the film thickness after developing of a negative resist and that of a positive resist, respectively, in relation to the exposure threshold value Eth. The film thickness obtained after developing becomes zero at an area exposed at an exposure amount greater than the exposure threshold value Eth in the case of the positive resist, and at an area exposed at an exposure amount less than the exposure threshold value Eth in the case of the negative resist.

Figure 7B:
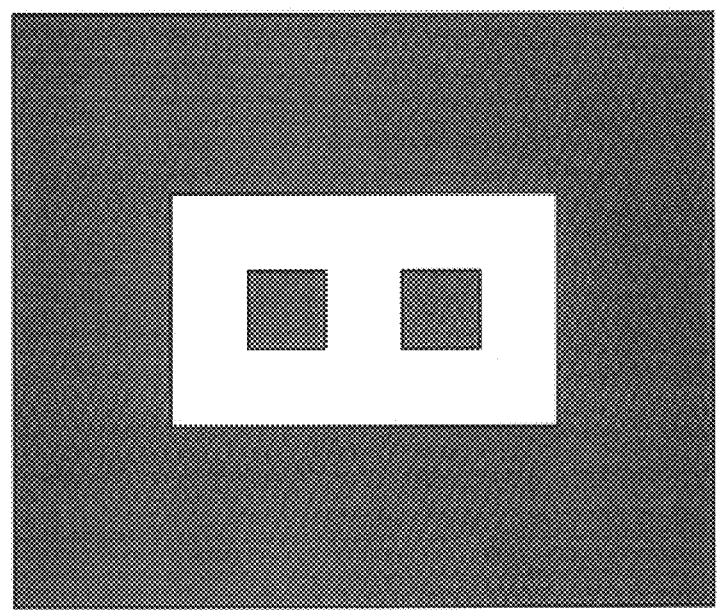
Figure 9:
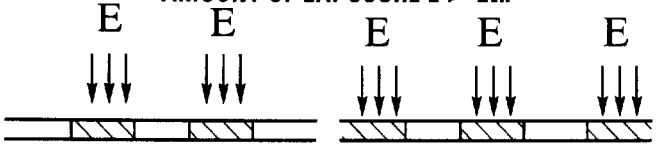
FIG. 9 shows the formation of a pattern by a developing process.
Figure 9:
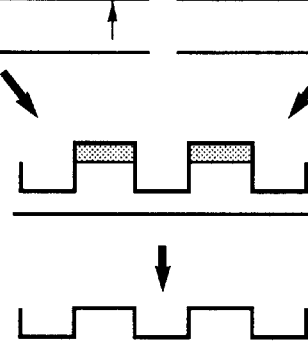

Accordingly, a desired resist pattern as shown in FIG. 7(b) can be obtained in the above-stated manner. Additionally, FIG. 9 is a schematic diagram showing the manner of forming a lithography pattern through the developing process and the etching process after the above-described multiple exposure with respect to the negative resist and the positive resist.

Figure 41:
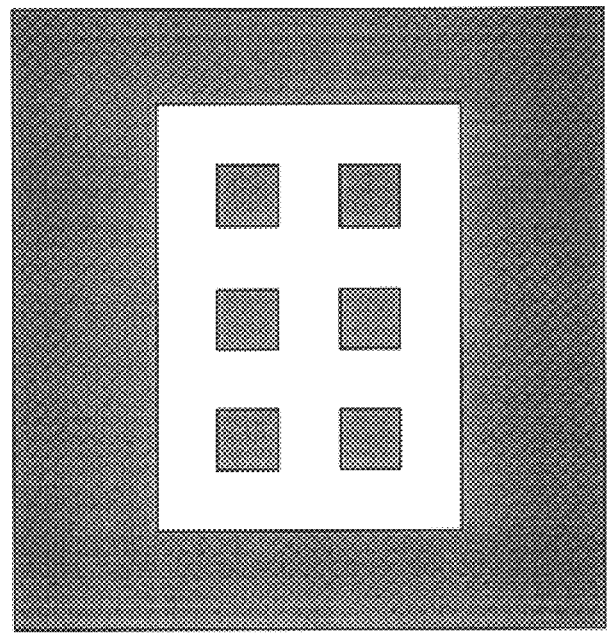
FIG. 41 is a diagram for explaining a conventional pattern.

Next, masks and an exposure method according to a second embodiment of the invention are described with reference to FIG. 10 to FIGS. 14(a) and 14(b). In the case of the second embodiment shown in FIG. 10 to FIGS. 14(a) and 14(b), an example is taken in which a multiple exposure is made with a desired pattern as shown in FIG. 41.

Figure 10:
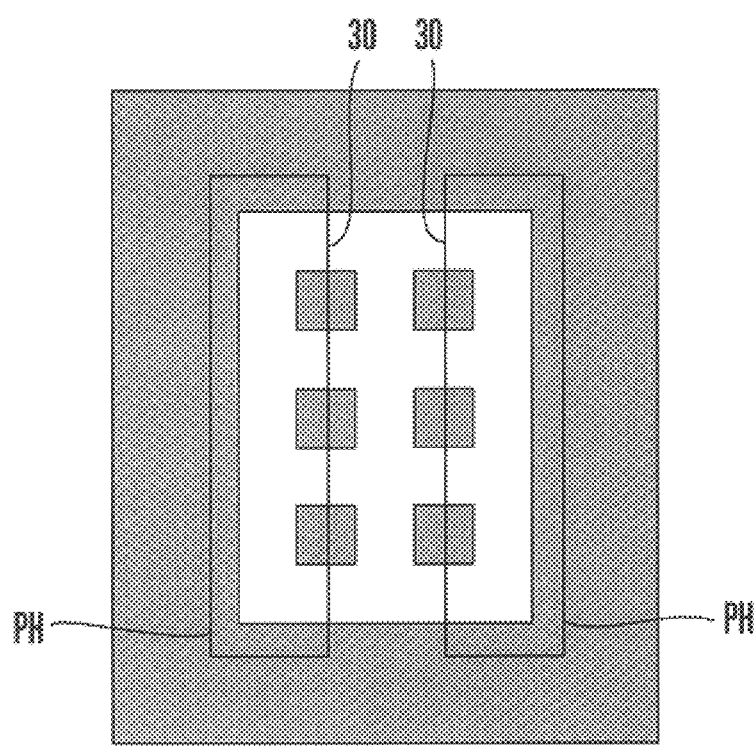
FIG. 10 is a diagram for explaining the pattern arrangement of a first mask in a second embodiment of the invention.
Figure 11:
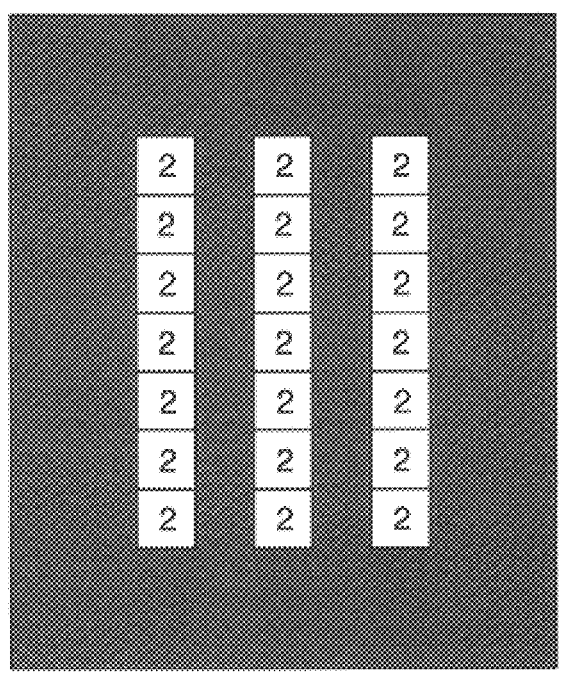
FIG. 11 is a diagram for explaining the distribution of exposure amounts obtained on the surface of a wafer with a first exposure in the second embodiment of the invention.

In the case of the second embodiment, a wafer is first subjected to a first pattern exposure process with an exposure amount distribution pattern as shown in FIG. 11, using a first mask in which phase shift areas PH as shown in FIG. 10 are set to resolve vertical minute lines in view of a vertical minute pattern.

Figure 12:
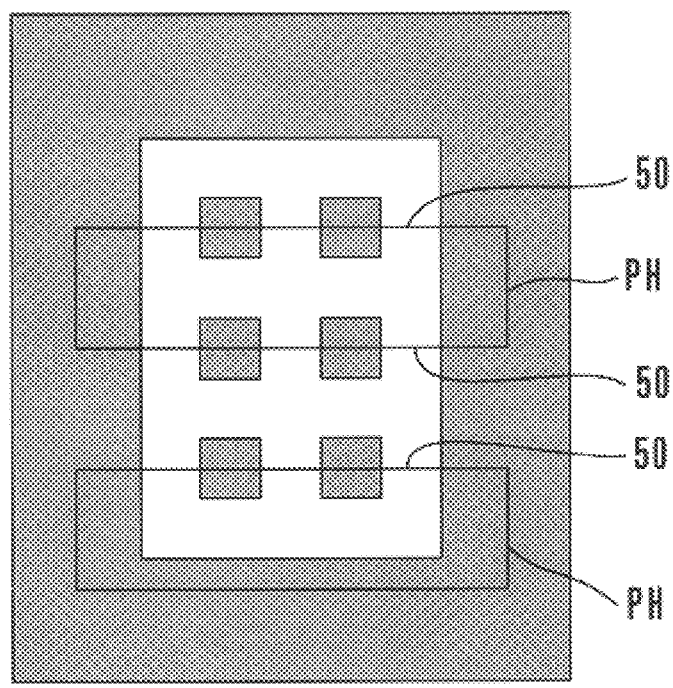
FIG. 12 is a diagram for explaining the pattern arrangement of a second mask in the second embodiment of the invention.
Figure 13:
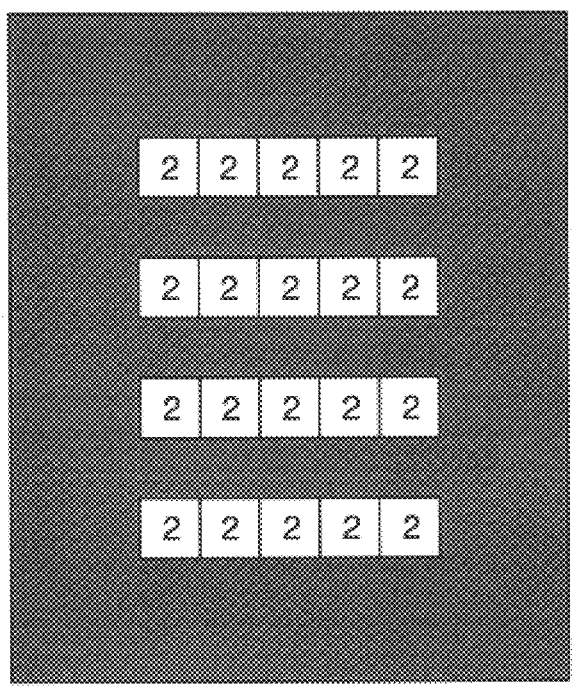
FIG. 13 is a diagram for explaining the distribution of exposure amounts obtained on the surface of the wafer with a second exposure in the second embodiment.

Subsequently, the wafer is subjected to a second pattern exposure process with an exposure amount distribution pattern as shown in FIG. 13, using a second mask in which phase shift areas PH as shown in FIG. 12 are set to resolve horizontal minute lines in view of a horizontal minute pattern.

Figure 14A:
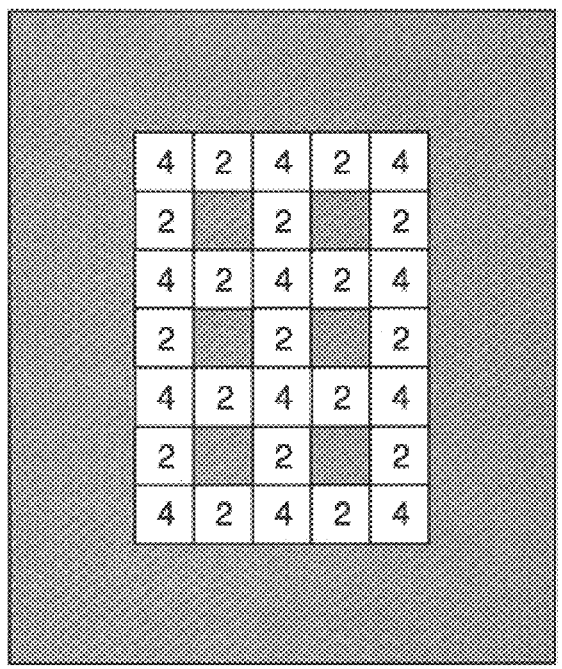
FIGS. 14(*a*) and 14(*b*) are diagrams for explaining respectively the distribution of exposure amounts and a resist image obtained by a double exposure in the second embodiment.
Figure 14B:
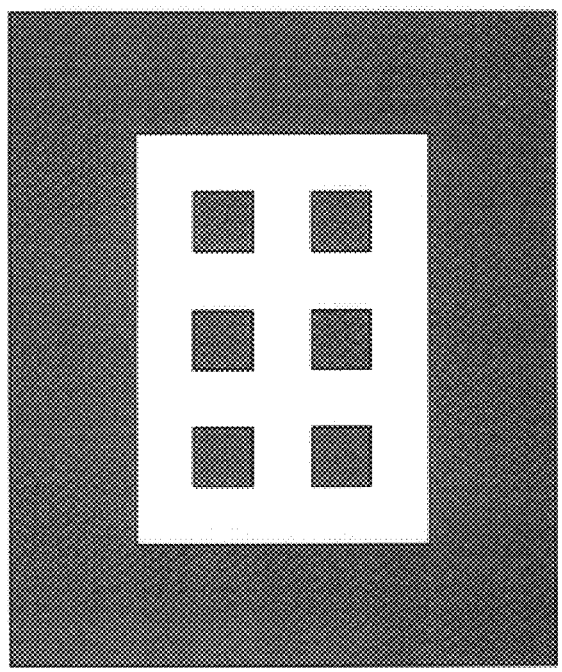

With the wafer double-exposed in the above-described manner, a total exposure amount distribution as shown in FIG. 14(a) is obtained on the wafer. Then, by setting an exposure threshold value of a resist of the wafer in the same manner as in the case of the first embodiment, a desired resist pattern as shown in FIG. 14(b) can be obtained.

Figure 15:
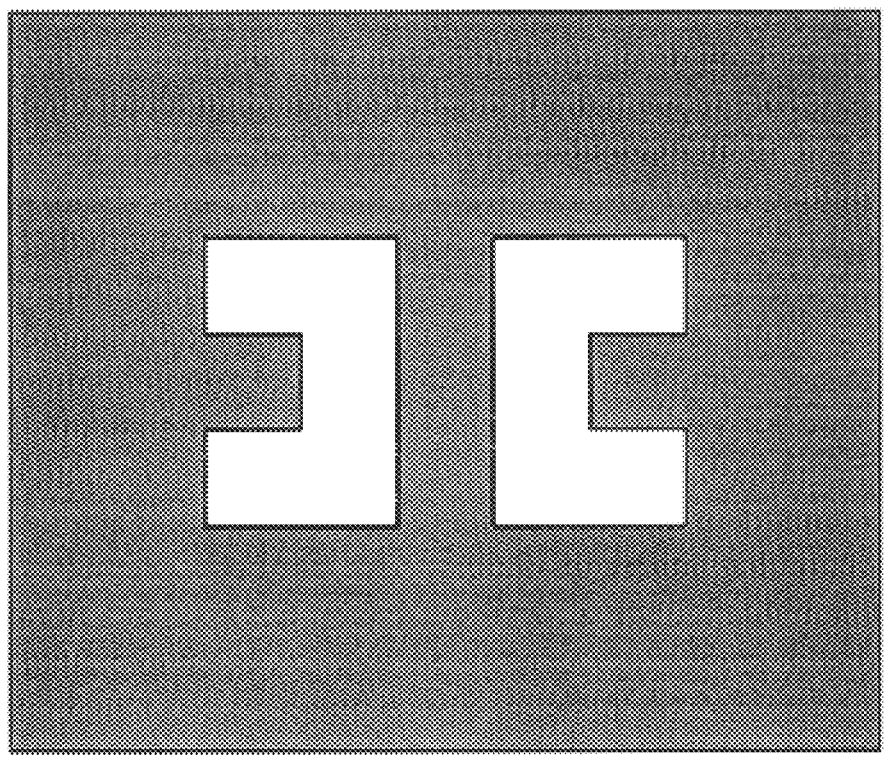
FIG. 15 is a diagram for explaining an exposure pattern in a third embodiment of the invention.

FIG. 15 is a diagram for explaining a pattern according to a third embodiment of the invention. FIG. 16 to FIGS. 20(a) and 20(b) are diagrams for explaining masks and an exposure method according to the third embodiment.

Figure 16:
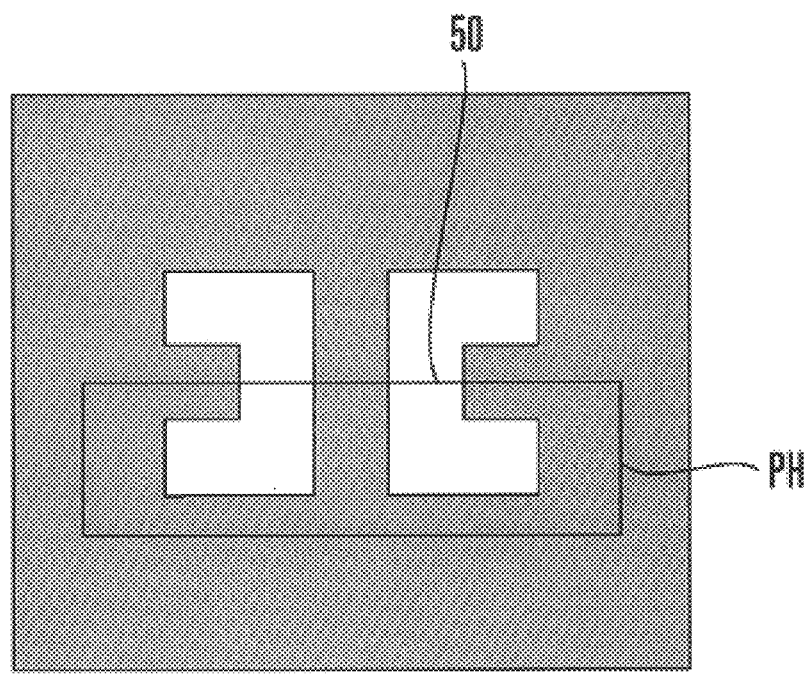
FIG. 16 is a diagram for explaining the pattern arrangement of a first mask in the third embodiment of the invention.
Figure 17:
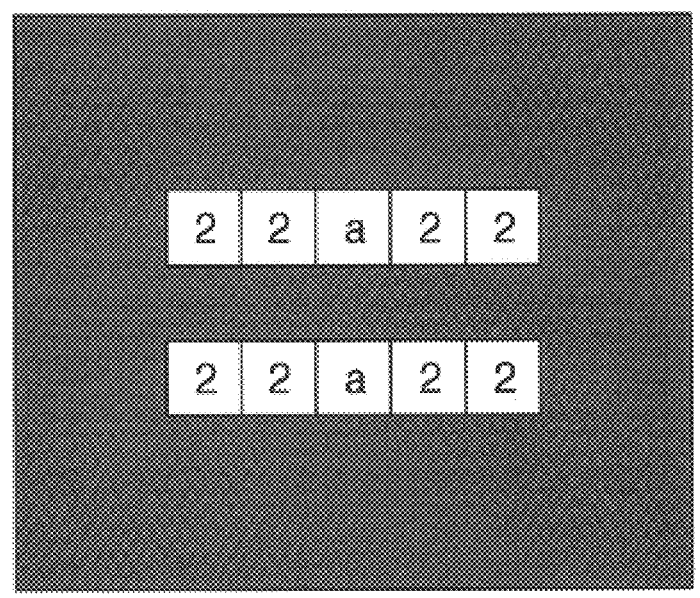
FIG. 17 is a diagram for explaining the distribution of exposure amounts obtained on the surface of a wafer with a first exposure in the third embodiment of the invention.

In the case of the third embodiment, a wafer is first subjected to a first pattern exposure process with an exposure amount distribution pattern as shown in FIG. 17, using a first mask in which a phase shift area PH as shown in FIG. 16 is set to resolve horizontal minute lines in view of a horizontal minute pattern. In FIG. 17, reference symbol "a" denotes portions which result from a blurred state and have an exposure amount smaller than "1".

Figure 18:
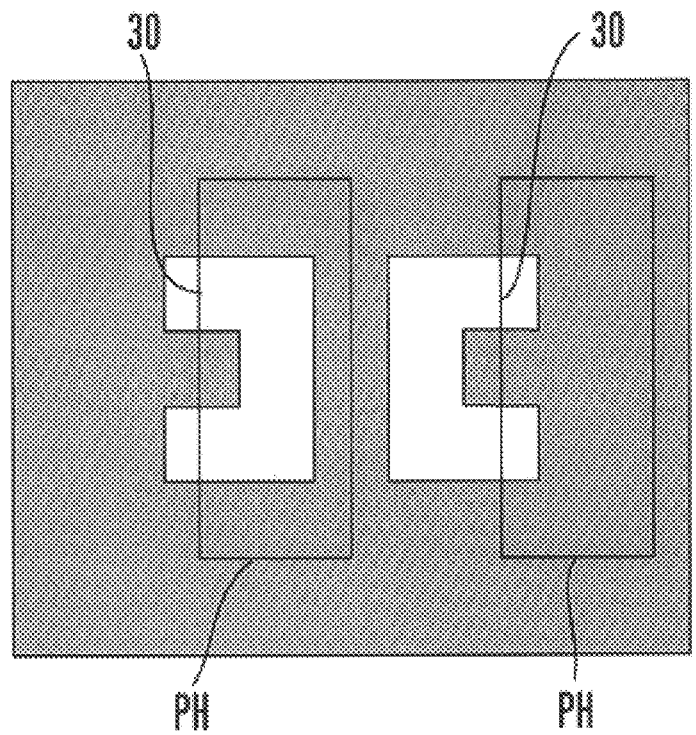
FIG. 18 is a diagram for explaining the pattern arrangement of a second mask in the third embodiment of the invention.
Figure 19:
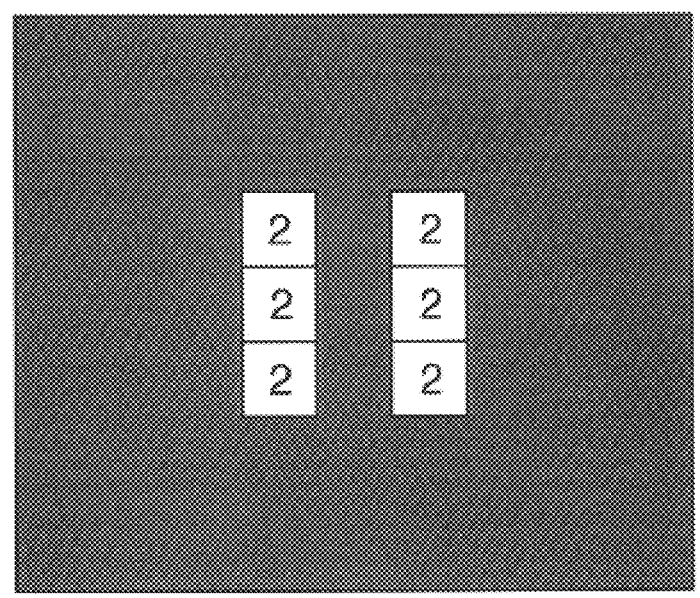
FIG. 19 is a diagram for explaining the distribution of exposure amounts obtained on the surface of the wafer with a second exposure in the third embodiment.

Subsequently, the wafer is subjected to a second pattern exposure process with an exposure amount distribution pattern as shown in FIG. 19, using a second mask in which phase shift areas PH as shown in FIG. 18 are set to resolve vertical minute lines in view of a vertical minute pattern.

Figure 20A:
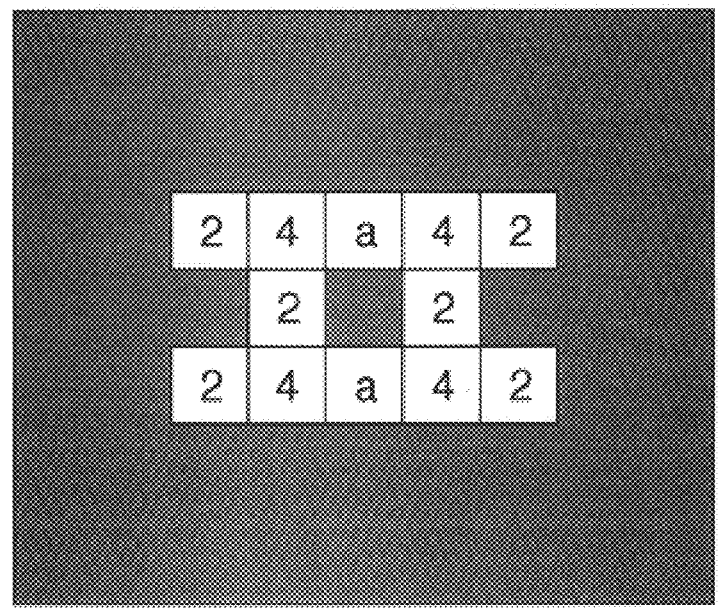
FIGS. 20(*a*) and 20(*b*) are diagrams for explaining respectively the distribution of exposure amounts and a resist image obtained by a double exposure in the third embodiment.
Figure 20B:
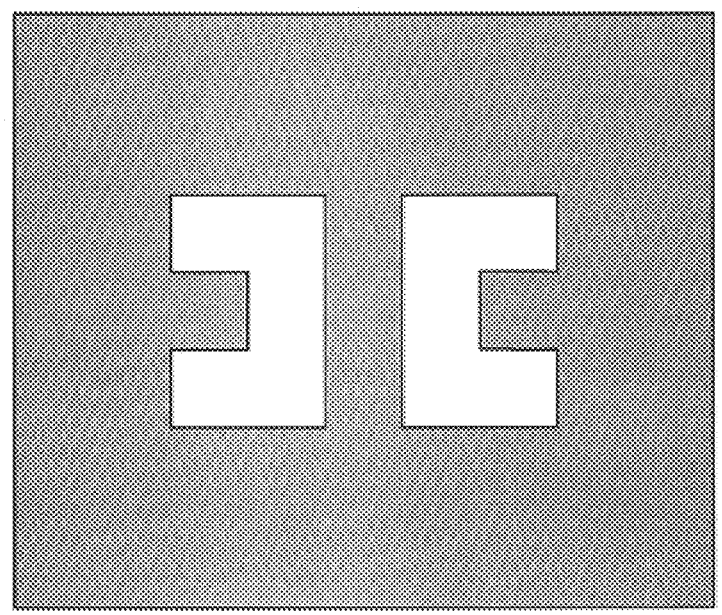

With the wafer double-exposed in the above-described manner, a total exposure amount distribution as shown in FIG. 20(a) is obtained on the wafer. Then, by setting an exposure threshold value of a resist of the wafer to a value between "a" and "2", a desired resist pattern as shown in FIG. 20(b) can be obtained.

FIG. 21 to FIGS. 25(a) and 25(b) are diagrams for explaining masks and an exposure method according to a fourth embodiment of the invention. The fourth embodiment applies to a case where a multiple exposure is to be made with a pattern similar to the pattern as shown in FIG. 13 which is used in the third embodiment.

Figure 21:
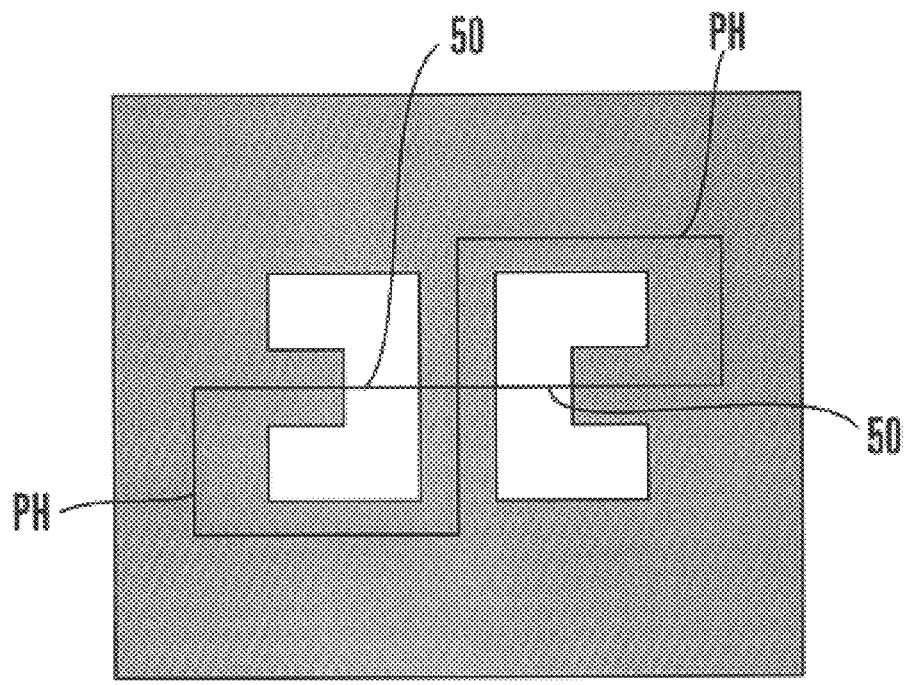
FIG. 21 is a diagram for explaining the pattern arrangement of a first mask in a fourth embodiment of the invention.
Figure 22:
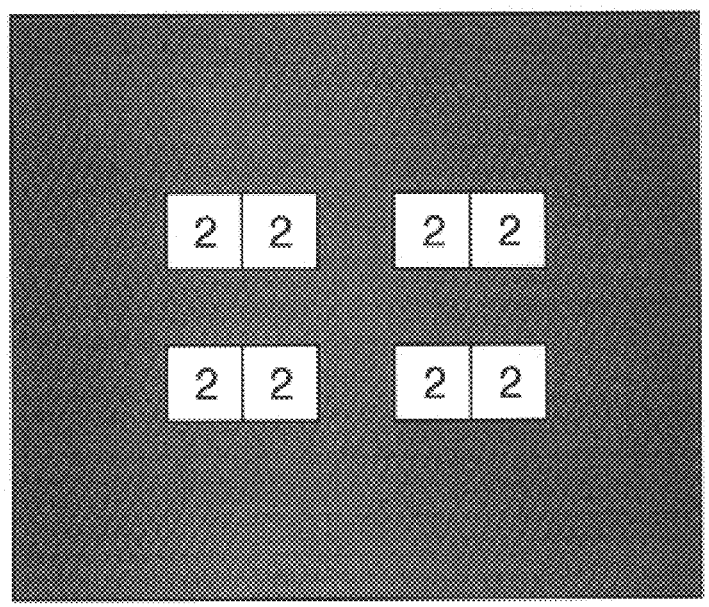
FIG. 22 is a diagram for explaining the distribution of exposure amounts obtained on the surface of a wafer with a first exposure in the fourth embodiment of the invention.

In the case of the fourth embodiment, a wafer is first subjected to a first pattern exposure process with an exposure amount distribution pattern as shown in FIG. 22, using a first mask in which phase shift areas PH as shown in FIG. 21 are set to resolve horizontal minute lines in view of a horizontal minute pattern. In this instance, a vertical direction is also partly taken into consideration to increase areas in which a minute pattern can be formed.

Figure 23:
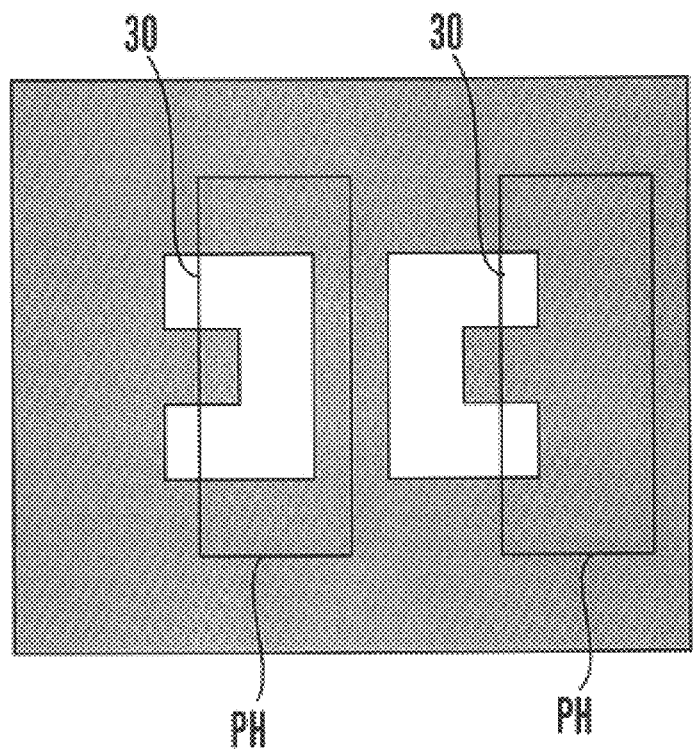
FIG. 23 is a diagram for explaining the pattern arrangement of a second mask in the fourth embodiment of the invention.
Figure 24:
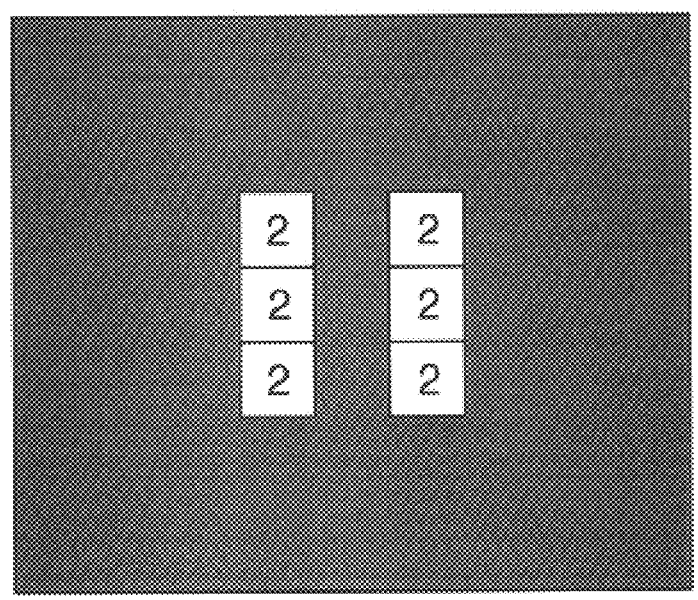
FIG. 24 is a diagram for explaining the distribution of exposure amounts obtained on the surface of the wafer with a second exposure in the fourth embodiment.

Subsequently, the wafer is subjected to a second pattern exposure process with an exposure amount distribution pattern as shown in FIG. 24, using a second mask in which phase shift areas PH as shown in FIG. 23 are set to resolve vertical minute lines in view of a vertical minute pattern.

Figure 25A:
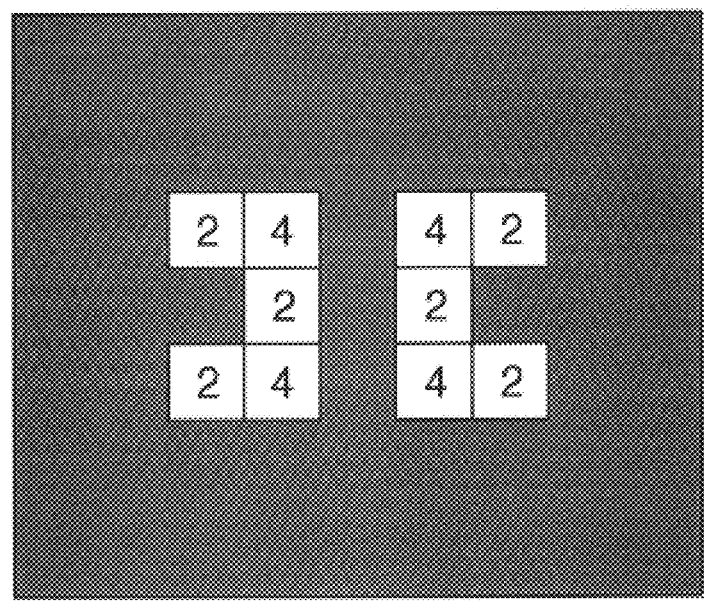
FIGS. 25(a) and 25(b) are diagrams for explaining respectively the distribution of exposure amounts and a resist image obtained by a double exposure in the fourth embodiment.
Figure 25B:
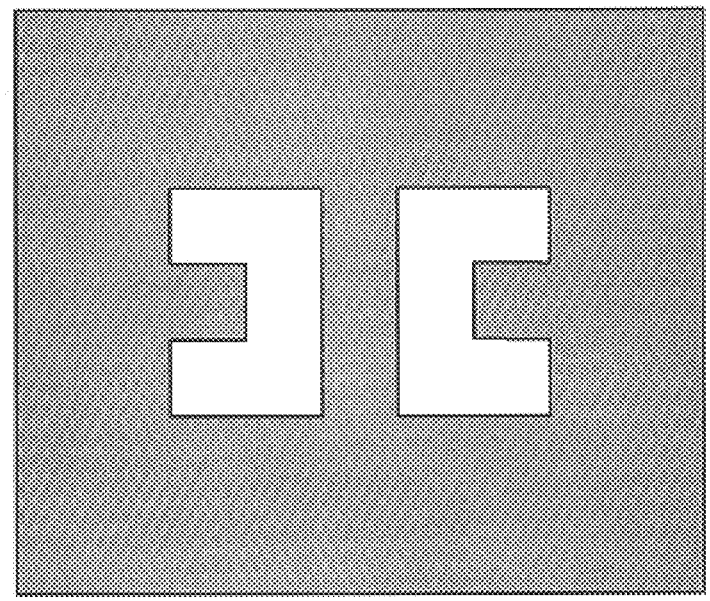

With the wafer double-exposed in the above-described manner, a total exposure amount distribution as shown in FIG. 25(a) is obtained on the wafer. Then, by setting an exposure threshold value of a resist of the wafer to a value between "0" and "2", a desired resist pattern as shown in FIG. 25(b) can be obtained.

Figure 42:
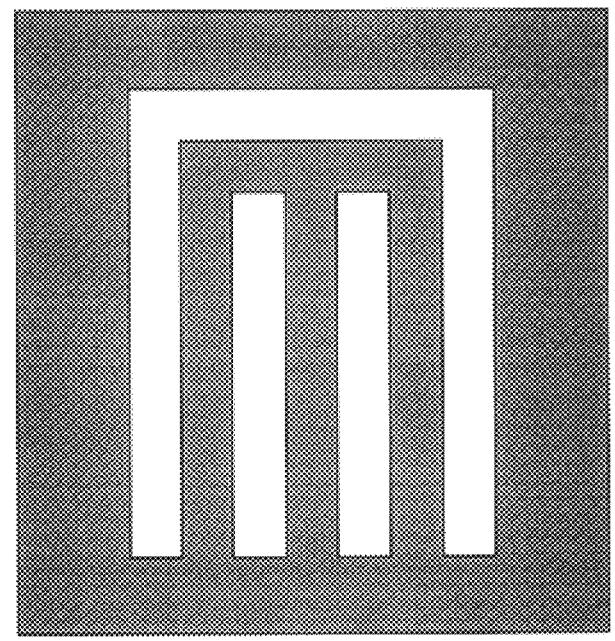
FIG. 42 is a diagram for explaining another conventional pattern.

FIG. 26 to FIGS. 30(a) and 30(b) are diagrams for explaining masks and an exposure method according to a fifth embodiment of the invention. The fifth embodiment applies to a case where a multiple exposure is to be made with a pattern as shown in FIG. 42.

Figure 26:
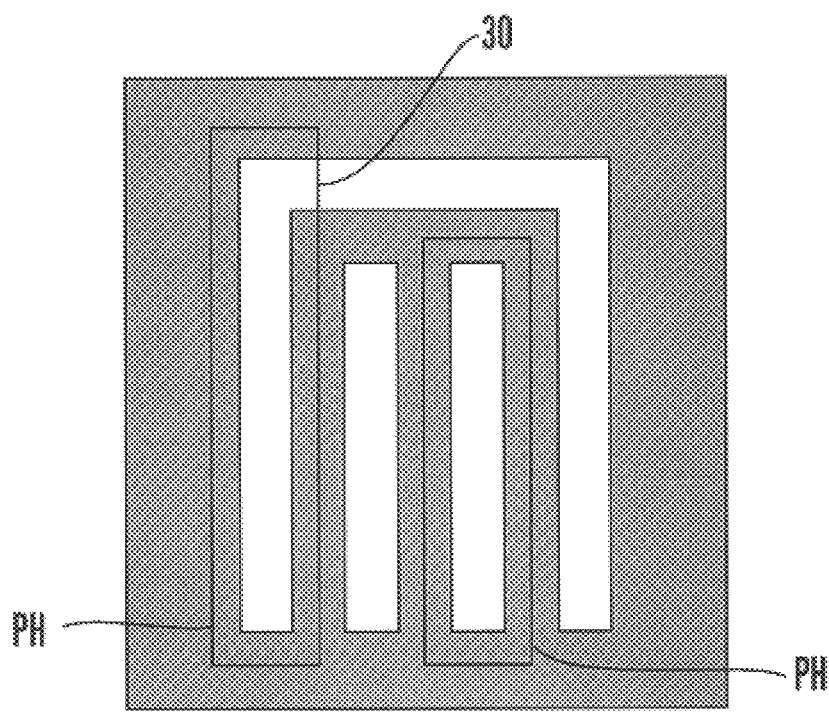
FIG. 26 is a diagram for explaining the pattern arrangement of a first mask in a fifth embodiment of the invention.
Figure 27:
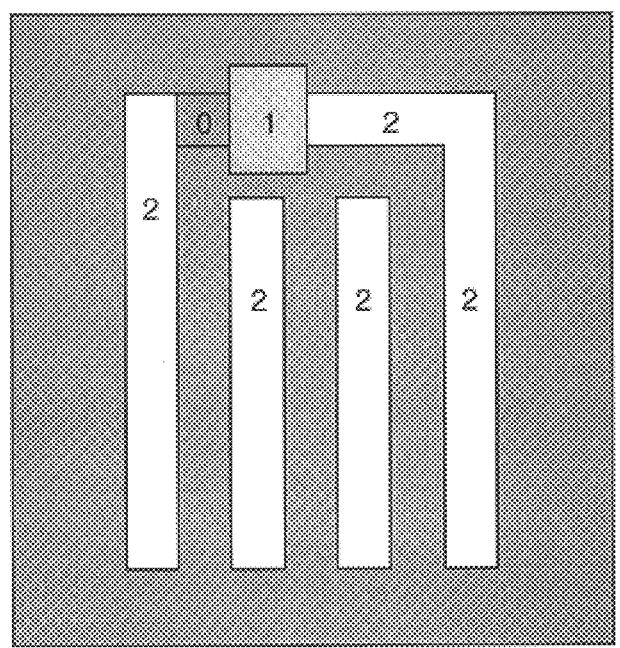
FIG. 27 is a diagram for explaining the distribution of exposure amounts obtained on the surface of a wafer with a first exposure in the fifth embodiment of the invention.

In the case of the fifth embodiment, a wafer is first subjected to a first pattern exposure process with an exposure amount distribution pattern as shown in FIG. 27, using a first mask in which phase shift areas PH as shown in FIG. 26 are set to resolve vertical minute lines in view of a vertical minute pattern.

Figure 28:
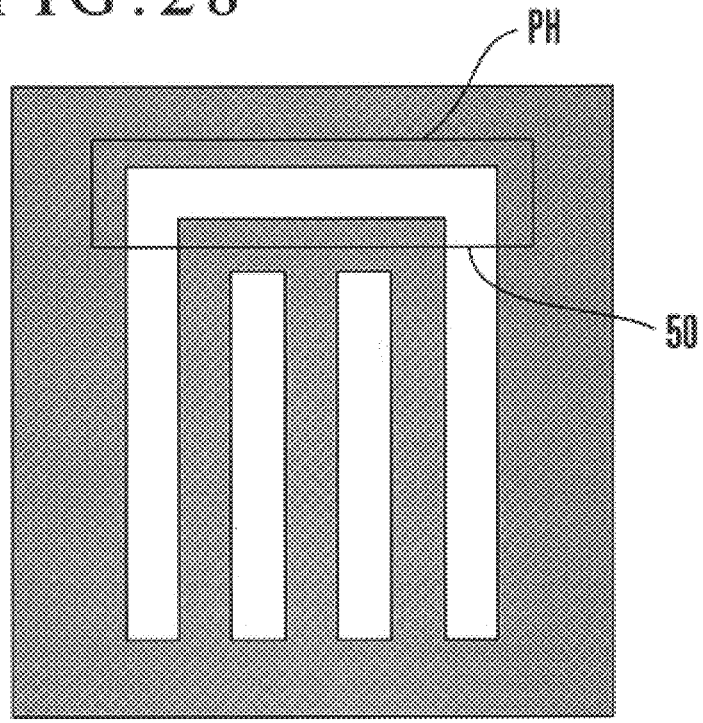
FIG. 28 is a diagram for explaining the pattern arrangement of a second mask in the fifth embodiment of the invention.
Figure 29:
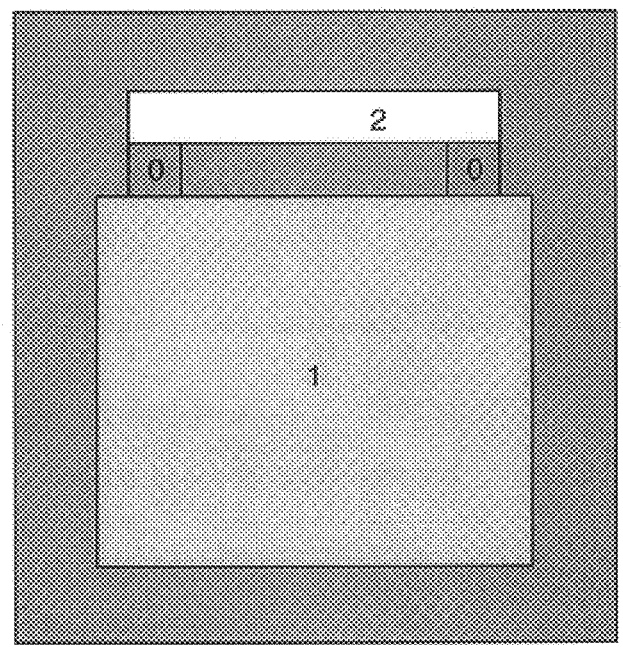
FIG. 29 is a diagram for explaining the distribution of exposure amounts obtained on the surface of the wafer with a second exposure in the fifth embodiment.

Subsequently, the wafer is subjected to a second pattern exposure process with an exposure amount distribution pattern as shown in FIG. 29, using a second mask in which a phase shift area PH as shown in FIG. 28 is set to resolve horizontal minute lines in view of a horizontal minute pattern.

Figure 30A:
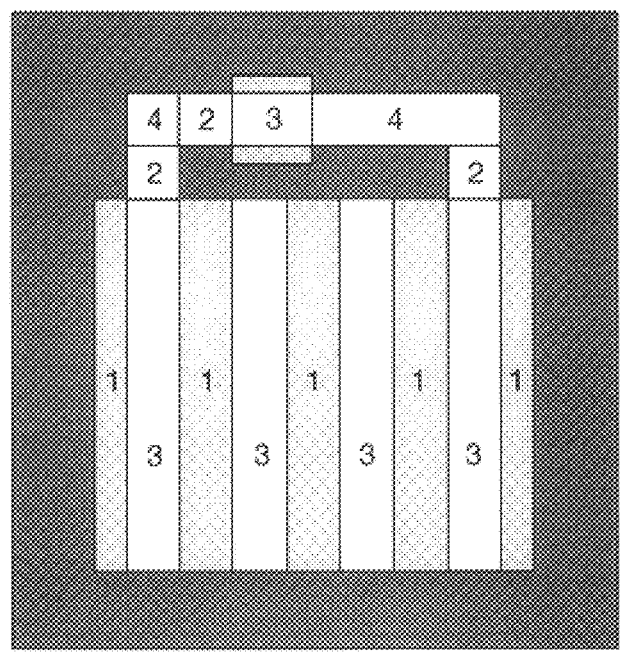
FIGS. 30(a) and 30(b) are diagrams for explaining respectively the distribution of exposure amounts and a resist image obtained by a double exposure in the fifth embodiment.
Figure 30B:
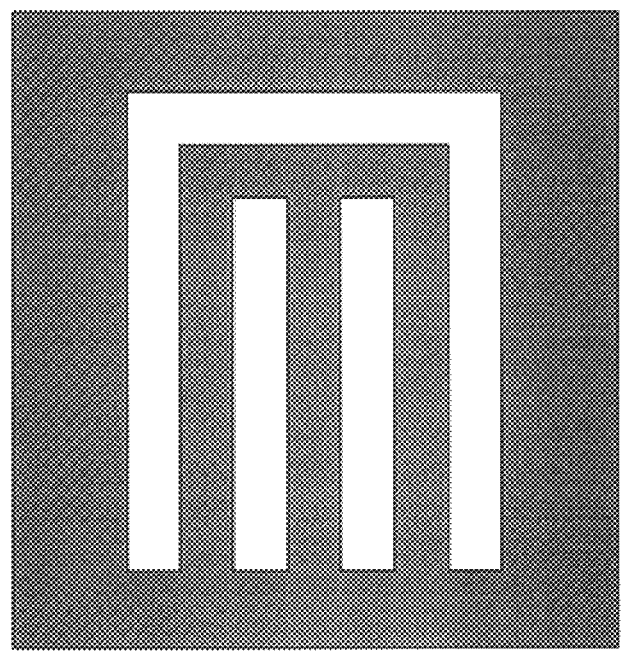

With the wafer double-exposed in the above-described manner, a total exposure amount distribution as shown in FIG. 30(a) is obtained on the wafer. Then, by setting an exposure threshold value of a resist of the wafer to a value between "0" and "2" as in the fourth embodiment, a desired resist pattern as shown in FIG. 30(b) can be obtained.

FIG. 31 to FIGS. 35(a) and 35(b) are diagrams for explaining masks and an exposure method according to a sixth embodiment of the invention. The sixth embodiment applies to a case where a multiple exposure is to be made with a pattern as shown in FIG. 42, similarly to the fifth embodiment.

Figure 31:
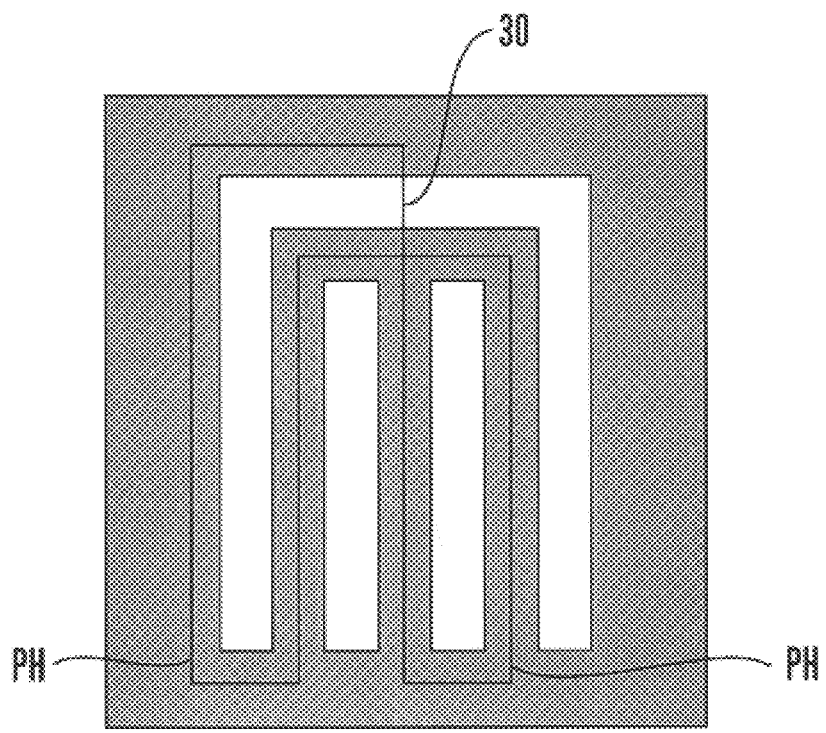
FIG. 31 is a diagram for explaining the pattern arrangement of a first mask in a sixth embodiment of the invention.
Figure 32:
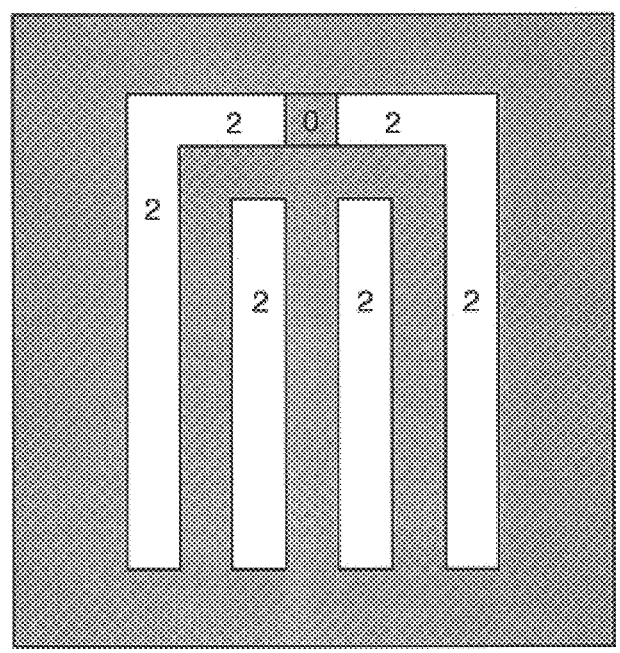
FIG. 32 is a diagram for explaining the distribution of exposure amounts obtained on the surface of a wafer with a first exposure in the sixth embodiment of the invention.

In the case of the sixth embodiment, a wafer is first subjected to a first pattern exposure process with an exposure amount distribution pattern as shown in FIG. 32, using a first mask in which phase shift areas PH as shown in FIG. 31 are set to resolve vertical minute lines in view of a vertical minute pattern. In this instance, a vertical direction is also partly taken into consideration to increase areas in which a minute pattern can be formed.

Figure 33:
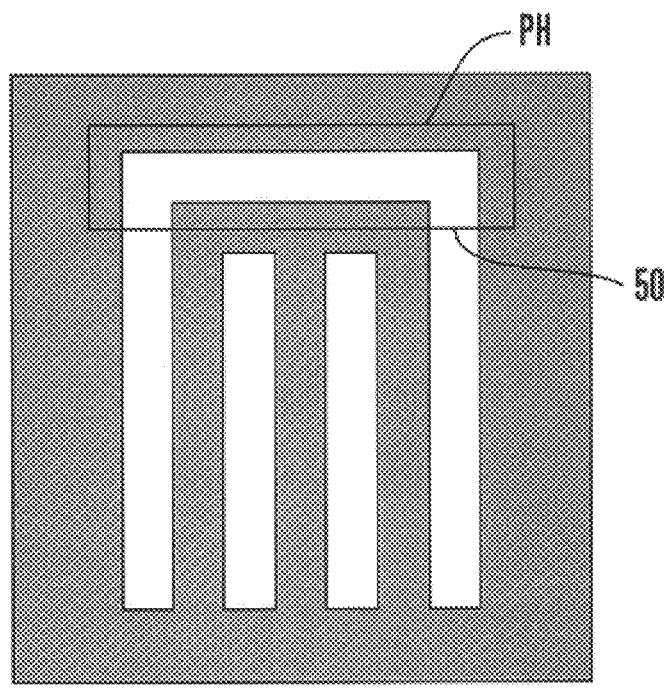
FIG. 33 is a diagram for explaining the pattern arrangement of a second mask in the sixth embodiment of the invention.
Figure 34:
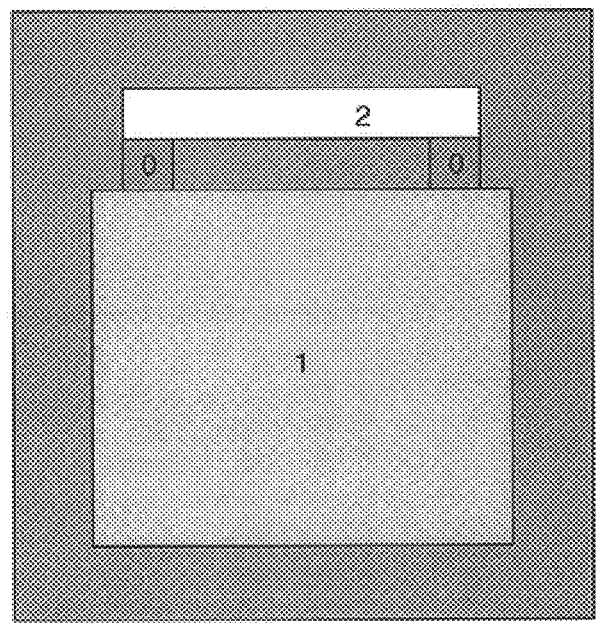
FIG. 34 is a diagram for explaining the distribution of exposure amounts obtained on the surface of the wafer with a second exposure in the sixth embodiment.

Subsequently, the wafer is subjected to a second pattern exposure process with an exposure amount distribution pattern as shown in FIG. 34, using a second mask in which a phase shift area PH as shown in FIG. 33 is set to resolve horizontal minute lines in view of a horizontal minute pattern.

Figure 35A:
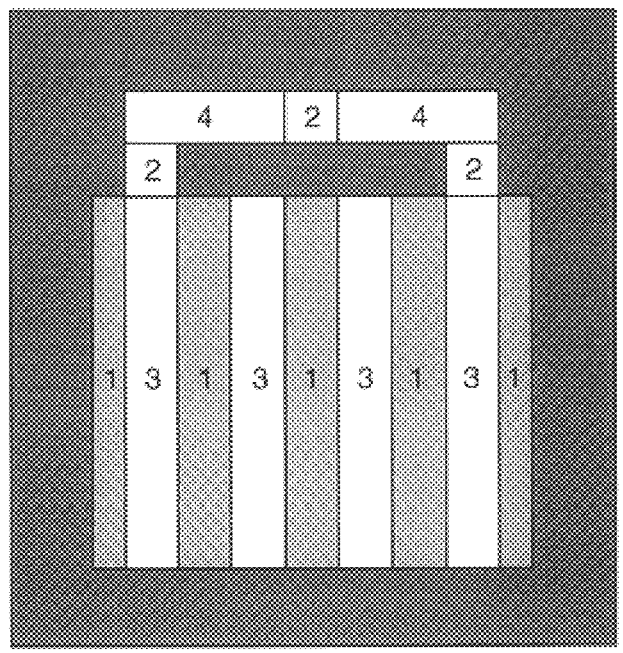
FIGS. 35(a) and 35(b) are diagrams for explaining respectively the distribution of exposure amounts and a resist image obtained by a double exposure in the sixth embodiment.
Figure 35B:
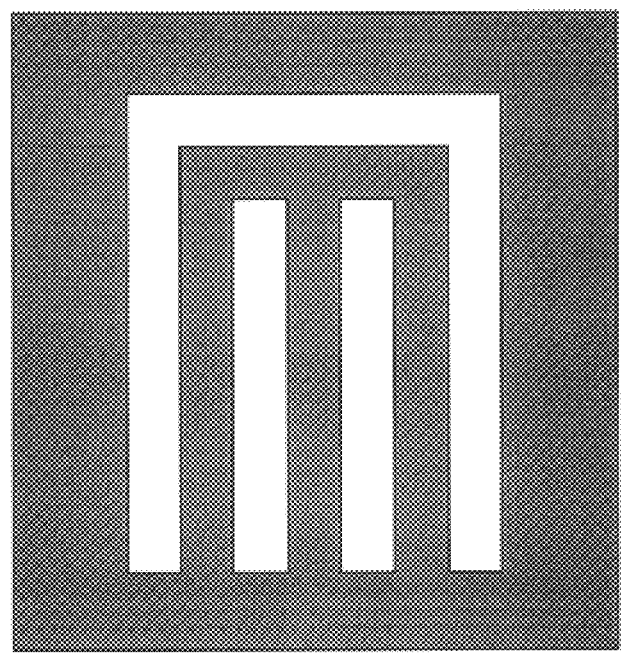

With the wafer double-exposed in the above-described manner, a total exposure amount distribution as shown in FIG. 35(a) is obtained on the wafer. Then, by setting an exposure threshold value of a resist of the wafer to a value between "0" and "2" as in the fifth embodiment, a desired resist pattern as shown in FIG. 35(b) can be obtained.

Further, according to the invention, exposures may be made with three or more patterns by using three or more masks as one set of masks, which have phase shift areas arranged to give respective different phase shifting effects for a desired pattern.

Figure 36:
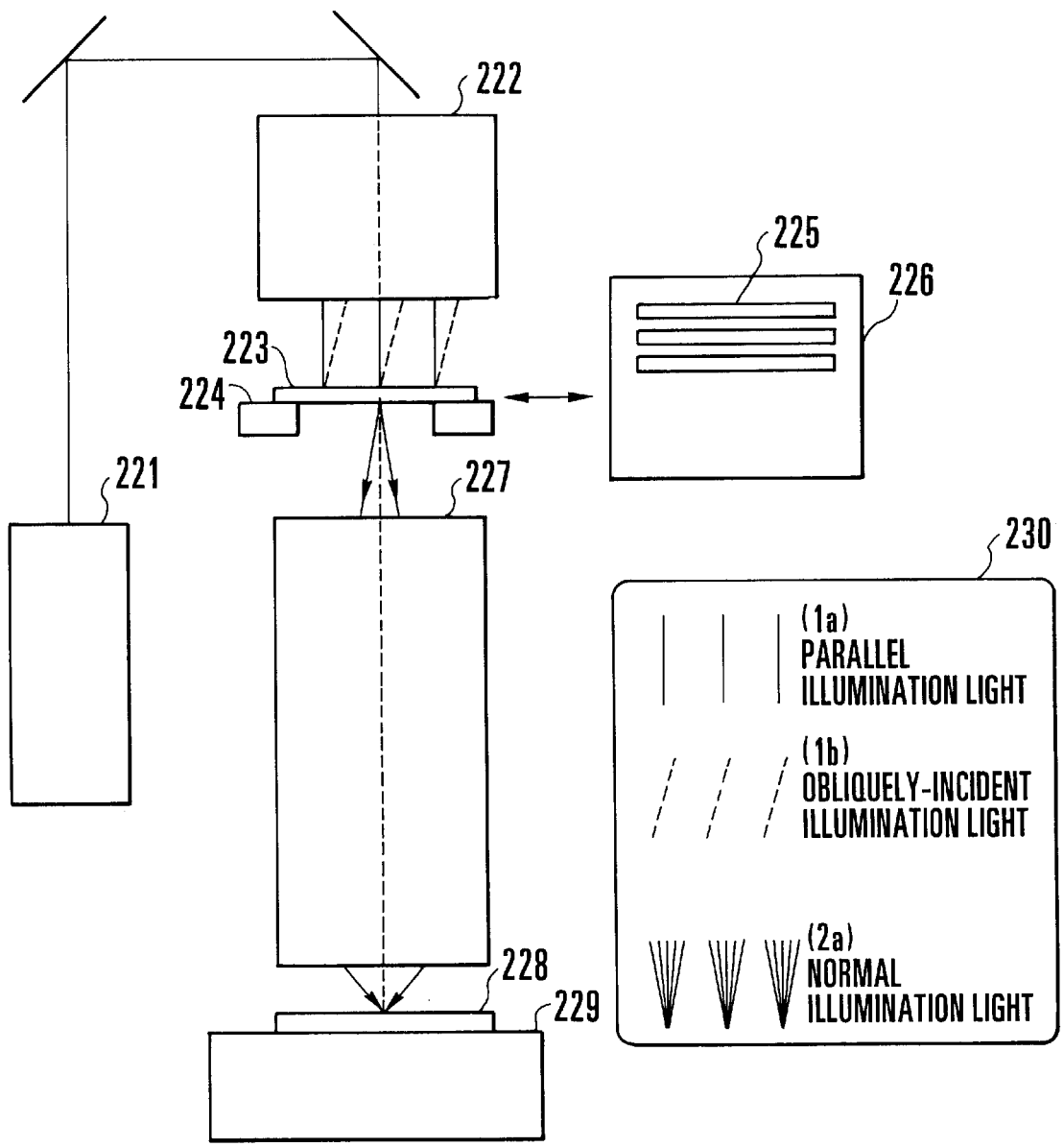
FIG. 36 is a schematic diagram showing the essential parts of an exposure apparatus according to the invention.

FIG. 36 is a schematic diagram showing the arrangement of essential parts of a high-resolution exposure apparatus, which is arranged to make a multiple exposure using one set of exposure masks which are provided with phase shift areas having respective different phase shifting effects for a desired pattern.

The illustration of FIG. 36 includes a KrF, an ArF or an F2 excimer laser 221, an illumination optical system 222, a mask (reticle) 223, a mask stage 224, a projection optical system 227 arranged to project the circuit pattern of the mask 223 on a wafer 228 in a demagnifying manner, and a mask (reticle) changer 225 arranged to selectively supply one of the set of masks to the mask stage 224.

The illustration of FIG. 36 further includes an XYZ stage 229 on which the wafer 228 is placed for the projection exposure. The XYZ stage 229 is movable on a plane perpendicular to an optical axis of the projection optical system 227 and also in the direction of the optical axis. The position of the XYZ stage 229 in X and Y directions can be accurately controlled by means of a laser interferometer or the like.

The exposure apparatus shown in FIG. 36 is further provided with parts which are not shown, such as a reticle alignment optical system and a wafer alignment optical system, including an off-axis alignment optical system, a TTL alignment optical system and a TTR alignment optical system.

The illumination optical system 222 of the exposure apparatus shown in FIG. 36 is arranged to permit switching between partly-coherent illumination and coherent illumination. In the case of the coherent illumination, illumination light (1a) or (1b) which is shown within a block 230 in FIG. 36 is supplied to one of the above-stated set of masks. In the case of the partly-coherent illumination, illumination light (2a) which is shown also within the block 230 is supplied to an applicable reticle.

The partly-coherent illumination can be switched over to the coherent illumination by replacing an aperture stop which is normally disposed immediately behind a fly's eye lens of the illumination optical system 222 with an aperture stop which is used for the coherent illumination and has a sufficiently smaller aperture than the aperture stop used for the partly-coherent illumination.

By using the exposure method and the exposure apparatus described above, devices of varied kinds can be manufactured, including a semiconductor chip such as an IC or LSI, a display element such as a liquid crystal panel or the like, a detecting element such as a magnetic head or the like and an image sensor such as a CCD.

The invention is not limited to the embodiments disclosed but is intended to cover various modifications and equivalent arrangements included within the spirit of the invention. Particularly, it is possible to select as desired the number of times of exposure and the amount of exposure at each step of exposure to be made with the one set of masks. Further, it is also possible to have overlapped exposures by shifting one exposure position from the other by adjusting the relative positions as desired. Such adjustment effectively broadens a possible range of variations of each circuit pattern to be formed.

Next, a method for manufacturing a semiconductor device by using the above-described exposure apparatus is described below.

Figure 37:
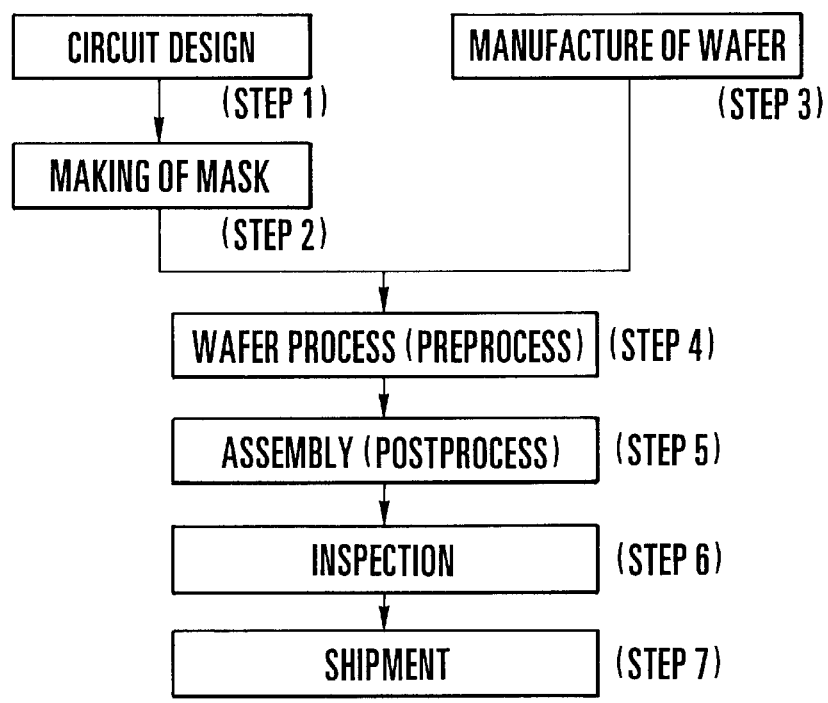
FIG. 37 is a flow chart showing a device manufacturing method according to the invention.

FIG. 37 shows a flow of manufacturing processes for manufacturing a device which is a semiconductor chip such as an IC, LSI or the like, a liquid crystal panel, a CCD or the like.

At a step 1 (circuit design), a circuit pattern is designed for the semiconductor device. At a step 2 (making of mask), a mask on which the designed circuit pattern is formed is made.

Meanwhile, at a step 3 (manufacture of wafer), a wafer is manufactured using a silicon material or the like. At a step 4 (wafer process), which is called a preprocess, an actual circuit is formed, by lithography, on the wafer manufactured at the step 3 while using the mask made at the step 2.

At a step 5 (assembly), which is called a postprocess, a semiconductor chip is obtained from the wafer processed at the step 4. The step 5 includes an assembly process (dicing and bonding processes), a packaging process (a chip sealing process), etc.

At a step 6 (inspection), tests are conducted for verifying the operation and durability of the semiconductor device obtained at the step 5. At a step 7 (shipment), the semiconductor device completed through the above-stated steps is shipped out.

Figure 38:
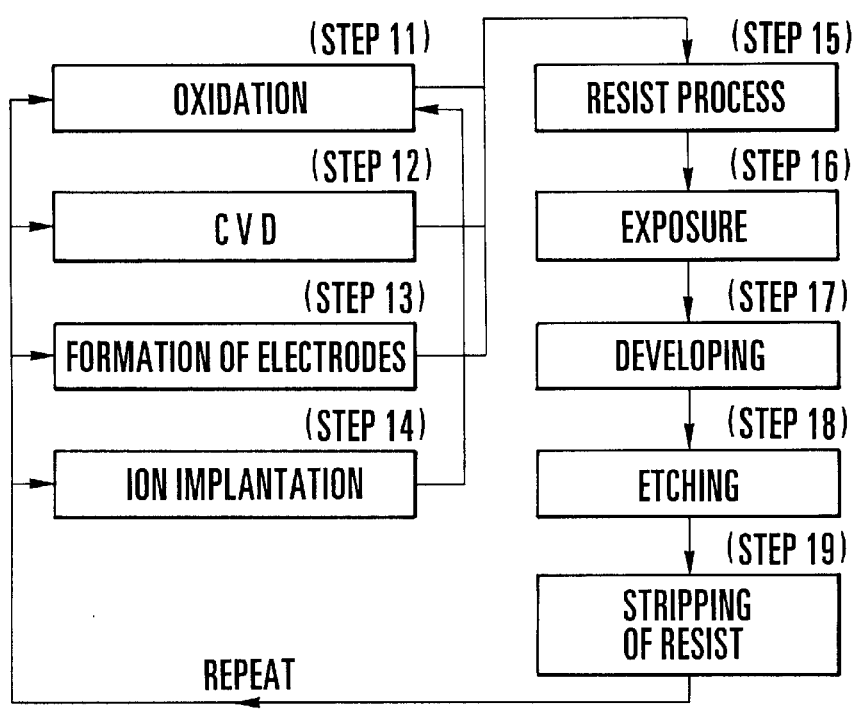
FIG. 38 is another flow chart showing the device manufacturing method according to the invention.
Figure 39:
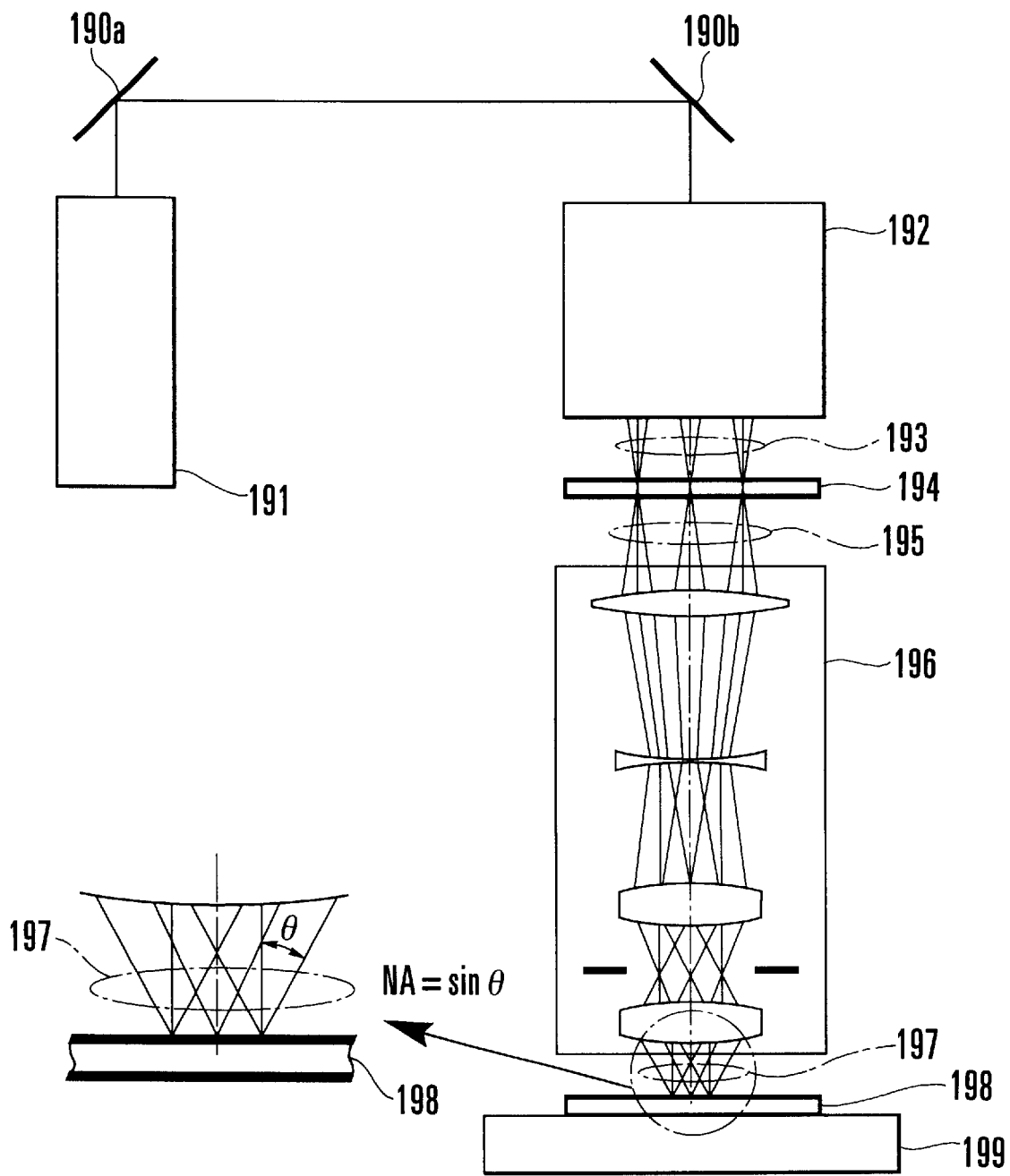
FIG. 39 is a schematic diagram showing the essential parts of the conventional exposure apparatus.
Figure 40A:
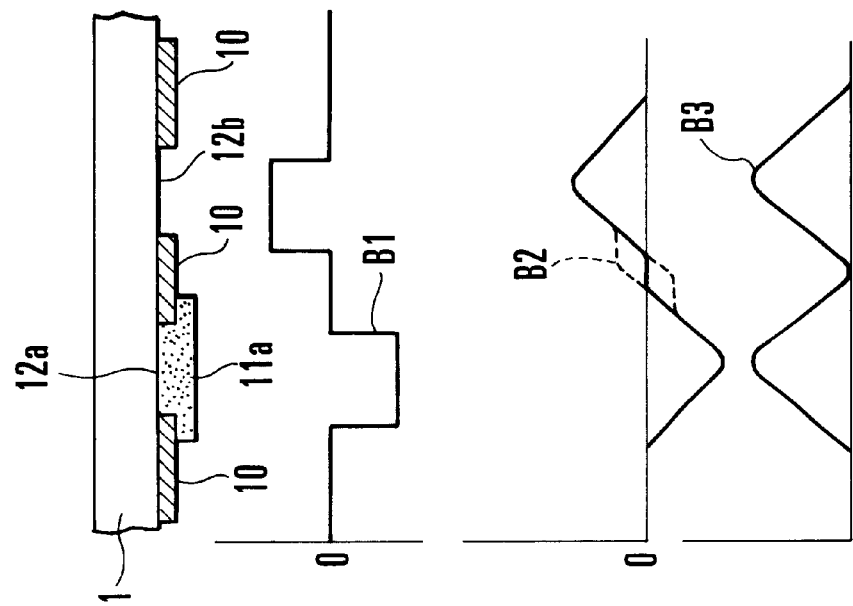
FIGS. 40(a) and 40(b) are diagrams for explaining the conventional phase shifting mask.
Figure 40B:
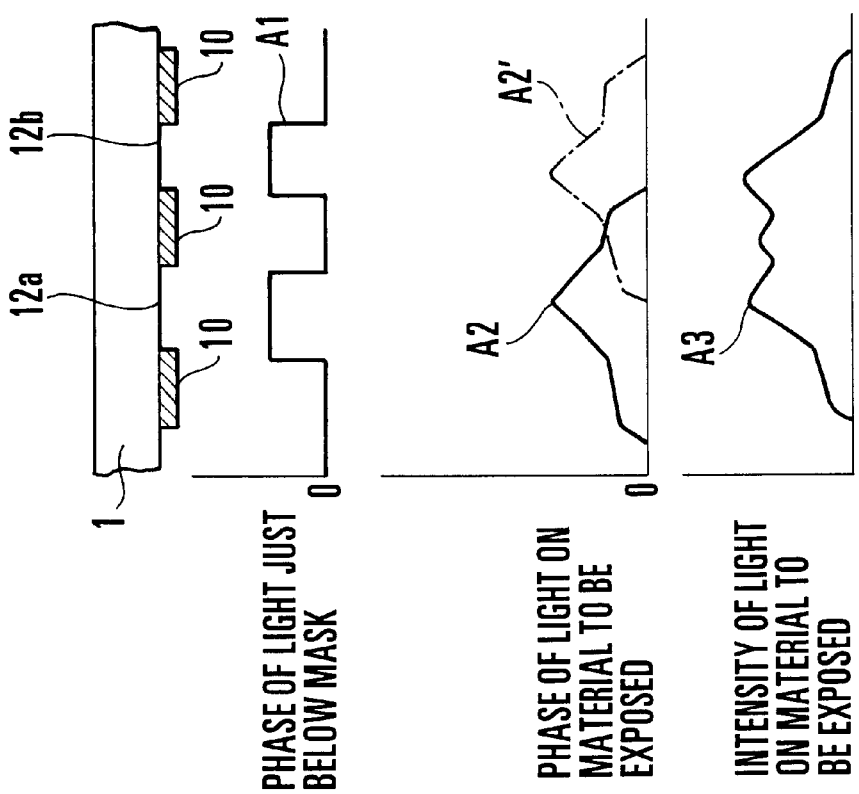

FIG. 38 is a flow chart showing the details of the above-stated wafer process (step 4) in FIG. 37. At a step 11 (oxidation), the surface of the wafer is oxidized. At a step 12 (CVD), an insulation film is formed to cover the surface of the wafer.

At a step 13 (formation of electrodes), electrodes are formed on the wafer by vapor deposition. At a step 14, ions are implanted into the wafer. At a step 15 (resist process), a photosensitive agent is coated to the wafer. At a step 16 (exposure), the wafer is exposed by the exposure apparatus to have the circuit pattern of the mask transferred and printed to the wafer.

At a step 17 (developing), the exposed wafer is subjected to a developing process. At a step 18 (etching), an etching process is performed to remove all parts of the resist other than the developed parts of the resist. At a step 19 (stripping of resist), the parts of the resist which have become unnecessary through the etching process are removed or stripped. A multiple circuit pattern is thus formed on the wafer by repeating the steps described above.

The manufacturing method according to the invention facilitates the manufacture of semiconductor devices of a high degree of integration.

What is claimed is:

1. An exposure method comprising;
   a first exposure step of exposing a resist through a first phase shift mask having a light-blocking part and a non-light-blocking part; and
   a second exposure step of exposing the resist through a second phase shift mask having a light-blocking part and a non-light-blocking part,
   wherein each of the non-light-blocking part of the first phase shift mask and the non-light-blocking part of the second phase shift mask has a shape and an orientation substantially the same as a pattern to be exposed, the first exposure step and the second exposure step are performed in order, in reverse order or simultaneously, and when the first and second steps are performed in order or in reverse order, the resist is not developed between the first and second steps, and the first phase shift mask is arranged such that predetermined areas, which are adjacent to each other at least in a first direction across the light-blocking part of the first phase shift mask, give a phase shift of substantially an odd-number of times as much as $\pi$ between light portions propagating through the respective predetermined areas while the second phase shift mask is arranged such that predetermined areas adjacent to each other at least in a second direction different from the first direction across the light-blocking part of the second phase shift mask, give a phase shift of substantially an odd-number of times as much as $\pi$ between light portions propagating through the respective predetermined areas.

2. A method according to claim 1, wherein the first phase shift mask is arranged such that the predetermined areas adjacent to each other in the first direction across the light-blocking part of the first phase shift mask give a phase shift substantially of $\pi$ between light portions propagating through the respective predetermined areas.

3. A method according to claim 2, wherein the second phase shift mask is arranged such that the predetermined areas adjacent to each other in the first direction across the light-blocking part of the second phase shift mask give a phase shift substantially of $\pi$ between light portions propagating through the respective predetermined areas.

4. A method according to claim 1, wherein the first direction and the second direction vertically cross each other.

5. An exposure method comprising:
   a first exposure step of exposing a resist through a first phase shift mask having a light-blocking part and a non-light-blocking part; and
   a second exposure. step of exposing the resist through a second phase shift mask having a light-blocking part and a non-light-blocking part,
   wherein each of the non-light-blocking part of the first phase shift mask and the non-light-blocking part of the second phase shift mask has a shape and an orientation substantially the same as a pattern to be exposed, the first and second exposure steps are performed in order, reverse order or simultaneously, and when the first and second exposure steps are performed in order or in reverse order, the resist is not developed, the first phase shift mask being arranged such that a boundary of phases is formed along a first direction in the non-light-blocking part thereof, and predetermined areas adjacent to each other across the boundary give a phase shift substantially of an odd-number of times as much as $\pi$ to light portions propagating the respective predetermined areas, while the second phase shift mask being arranged such that a boundary of phases is formed in a second direction different from the first direction in the non-light-blocking part thereof, and predetermined areas adjacent to each other across the boundary of phases give a phase shift substantially of an odd-number of times as much as $\pi$ between light portions propagating through the predetermined areas.

6. A method according to claim 5, wherein the first direction and the second direction vertically cross each other.

7. An exposure method comprising:
   a first exposure step of exposing a resist through a first phase shift mask having a light-blocking part and a non-light-blocking part; and
   a second exposure step of exposing the resist through a second phase shift mask having a light-blocking part and a non-light-blocking part,
   wherein each of the non-light-blocking part of the first phase shift mask and the non-light-blocking part of the second phase shift mask has a shape and an orientation the same as a pattern to be exposed, the first and second exposure steps are performed in order, in reverse order or simultaneously, and when the first and second exposure steps are performed in order or in reverse order, the resist is not developed, the first phase shift mask being arranged such that predetermined areas adjacent to each other at least in a first direction across the non-light-blocking part thereof give a phase shift substantially of an odd-number of times as much as $\pi$ to light portions propagating through the respective predetermined areas, and a boundary of phases is formed in a third direction in the non-light-blocking part thereof, and predetermined areas adjacent to each other across the phase boundary give a phase shift substantially of an odd-number of times as much as π to light portions propagating through the respective predetermined areas, while the second phase shift mask being arranged such that predetermined areas adjacent to each other at least in a second direction different from the first direction give a phase shift substantially of an odd-number of times as much as π between light portions propagating through the respective predetermined areas, and a boundary of phases is formed in a fourth direction different from the third direction in the non-light-blocking part thereof, and predetermined areas adjacent to each other across the phase boundary give a phase shift substantially of an odd-number of times as much as π between light portions propagating through the respective predetermined areas.

8. A method according to claim 7, wherein the first phase shift mask is arranged such that the predetermined areas adjacent to each other in the second direction across the light-blocking part thereof give a phase shift substantially of an odd-number of times as much as π between light portions propagating through the respective predetermined areas.

9. A method according to claim 7, wherein the second phase shift mask is arranged such that the predetermined areas adjacent to each other in the first direction across the light-blocking part thereto give a phase shift substantially of an odd-number of times as much as π between light portions propagating through the respective predetermined areas.

10. A method according to claim 7, wherein the first direction and the second direction vertically cross each other.

11. A method according to claim 7, wherein the third direction and the fourth direction vertically cross each other.

12. A method according to claim 7, wherein the first direction and the third direction vertically cross each other.

13. A method according to claim 7, wherein the second direction and the fourth direction vertically cross each other.

14. An exposure method comprising:
a first exposure step of exposing a resist through a first phase shift mask having a light-blocking part and a non-light-blocking part; and
a second exposure step of exposing the resist through a second phase shift mask having a light-blocking part and a non-light-blocking part,
wherein each of the non-light-blocking part of the first phase shift mask and the non-light-blocking part of the second phase shift mask has a shape and an orientation the same as a pattern to be exposed, the first and second exposure steps are performed in order, in reverse order or simultaneously, and when the first and second exposure steps are performed in order or in reverse order, the resist is not developed between the first and second exposure steps, the first phase shift mask being arranged to give a phase shift of an odd-number of times as much as π between light portions propagating through different areas within the non-light-blocking part so as to expose a portion of the non-light-blocking part on the resist by causing shading at a portion of the image of the non-light-blocking part, and the second phase shift mask being arranged to give a phase shift of an odd-number of times as much as π between light portions propagating through different areas within the non-light-blocking part so as to expose another portion of the non-light-blocking part on the resist by causing shading at another portion of the image of the non-light-blocking part.

15. A method according to claim 14, wherein the portion of the non-light-blocking part of the first phase shift mask and the other portion of the non-light-blocking part of the second phase shift mask have a common portion.

16. A method of producing a device, said method comprising:
a step of exposing a wafer with a device pattern by using an exposure method according to claim 1; and
a step of developing the exposed wafer.

17. A method of producing a device, said method comprising:
a step of exposing a wafer with a device pattern by using an exposure method according to claim 5; and
a step of developing the exposed wafer.

18. A method of producing a device, said method comprising:
a step of exposing a wafer with a device pattern by using an exposure method according to claim 7; and
a step of developing the exposed wafer.

19. A method of producing a device, said method comprising:
a step of exposing a wafer with a device pattern by using an exposure method according to claim 14; and
a step of developing the exposed wafer.

20. An exposure method for exposing a predetermined pattern, comprising:
a first exposure step of exposing a resist through a first phase shift mask having a light-blocking part and a non-light-blocking part; and
a second exposure step of exposing the resist through a second phase shift mask having a light-blocking part and a non-light-blocking part,
wherein a shape of a non-light-blocking part of said first phase shift mask, a shape of the non-light-blocking part of the second phase shift mask and a shape of said predetermined pattern are the same, an orientation of the non-light-blocking part of the first phase shift mask, an orientation of the non-light-blocking part of said second phase shift mask and an orientation of said predetermined pattern are the same, the first exposure step and the second exposure step are performed in order, in reverse order or simultaneously, and when the first and second steps are performed in order or in reverse order, the resist is not developed between the first and second steps, and the first phase shift mask is arranged such that predetermined areas, which are adjacent to each other at least in a first direction across the light-blocking part of the first phase shift mask, give a phase shift of substantially an odd-number of times as much as π between light portions propagating through the respective predetermined areas while the second phase shift mask is arranged such that predetermined areas adjacent to each other at least in a second direction different from the first direction across the light-blocking part of the second phase shift mask, give a phase shift of substantially an odd-number of times as much as π between light portions propagating through the respective predetermined areas.

21. A method of producing a device, said method comprising:
a step of exposing a wafer with a device pattern by using an exposure method according to claim 20; and
a step of developing the exposed wafer.

* * * * *

UNITED STATES PATENT AND TRADEMARK OFFICE
CERTIFICATE OF CORRECTION

PATENT NO.    : 6,544,721 B1
DATED         : April 8, 2003
INVENTOR(S)   : Kenji Saitoh It is certified that error appears in the above-identified patent and that said Letters Patent is hereby corrected as shown below:

Column 6,
Line 38, "n" should read -- $\pi$ --.

Column 7,
Line 39, "n" should read -- $\pi$ --.

Column 16,
Line 17, "exposure." should read -- exposure --.
Line 33, "propagating" should read -- propagating through --.

Signed and Sealed this

First Day of July, 2003

JAMES E. ROGAN
*Director of the United States Patent and Trademark Office*